US006941533B2

(12) United States Patent
Andreev et al.

(10) Patent No.: US 6,941,533 B2
(45) Date of Patent: Sep. 6, 2005

(54) CLOCK TREE SYNTHESIS WITH SKEW FOR MEMORY DEVICES

(75) Inventors: Alexander E. Andreev, San Jose, CA (US); Igor A. Vikhliantsev, Sunnyvale, CA (US); Ivan Pavisic, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 353 days.

(21) Appl. No.: 10/277,398

(22) Filed: Oct. 21, 2002

(65) Prior Publication Data

US 2004/0078766 A1 Apr. 22, 2004

(51) Int. Cl.[7] .............................................. G06F 17/50
(52) U.S. Cl. ...................... 716/6; 716/1; 716/7; 716/18
(58) Field of Search .............................. 716/1, 6, 7, 18

(56) References Cited

U.S. PATENT DOCUMENTS

| | | | | |
|---|---|---|---|---|
| 5,519,351 A | * | 5/1996 | Matsumoto | 327/295 |
| 5,557,779 A | * | 9/1996 | Minami | 716/6 |
| 5,912,820 A | * | 6/1999 | Kerzman et al. | 716/6 |
| 5,936,439 A | * | 8/1999 | Pollersbeck | 327/110 |
| 6,181,171 B1 | * | 1/2001 | Graf et al. | 327/110 |
| 6,305,001 B1 | * | 10/2001 | Graef | 716/12 |
| 6,324,678 B1 | * | 11/2001 | Dangelo et al. | 716/18 |
| 6,502,222 B1 | * | 12/2002 | Tetelbaum | 716/4 |
| 6,550,044 B1 | | 4/2003 | Pavisic et al. | |
| 6,553,370 B1 | | 4/2003 | Andreev et al. | |
| 6,559,701 B1 | | 5/2003 | Dillon | |
| 6,564,211 B1 | | 5/2003 | Andreev et al. | |
| 6,698,006 B1 | * | 2/2004 | Srinivasan et al. | 716/10 |
| 6,735,600 B1 | | 5/2004 | Andreev et al. | |
| 6,769,104 B2 | * | 7/2004 | Rodgers et al. | 716/66 |
| 6,782,519 B2 | * | 8/2004 | Chang et al. | 716/6 |

OTHER PUBLICATIONS

U.S. Appl. No. 09/679,313, filed Oct. 4, 2000, Andreev et al.

* cited by examiner

*Primary Examiner*—Stacy A. Whitmore
(74) *Attorney, Agent, or Firm*—Fitch, Even, Tabin & Flannery

(57) ABSTRACT

A method of synthesizing a clock tree for reducing peak power in an integrated circuit design includes partitioning a circuit design into a set of memory cells and a set of non-memory cells, partitioning the set of memory cells into segments, constructing a first clock tree having a first root vertex with a corresponding initial skew for each of the segments, constructing a second clock tree having a second root vertex with a corresponding initial skew for the set of non-memory cells, delay balancing the first root vertex and the second vertex clock tree, and inserting a clock buffer at a midpoint between the first root vertex and the second root vertex.

22 Claims, 12 Drawing Sheets

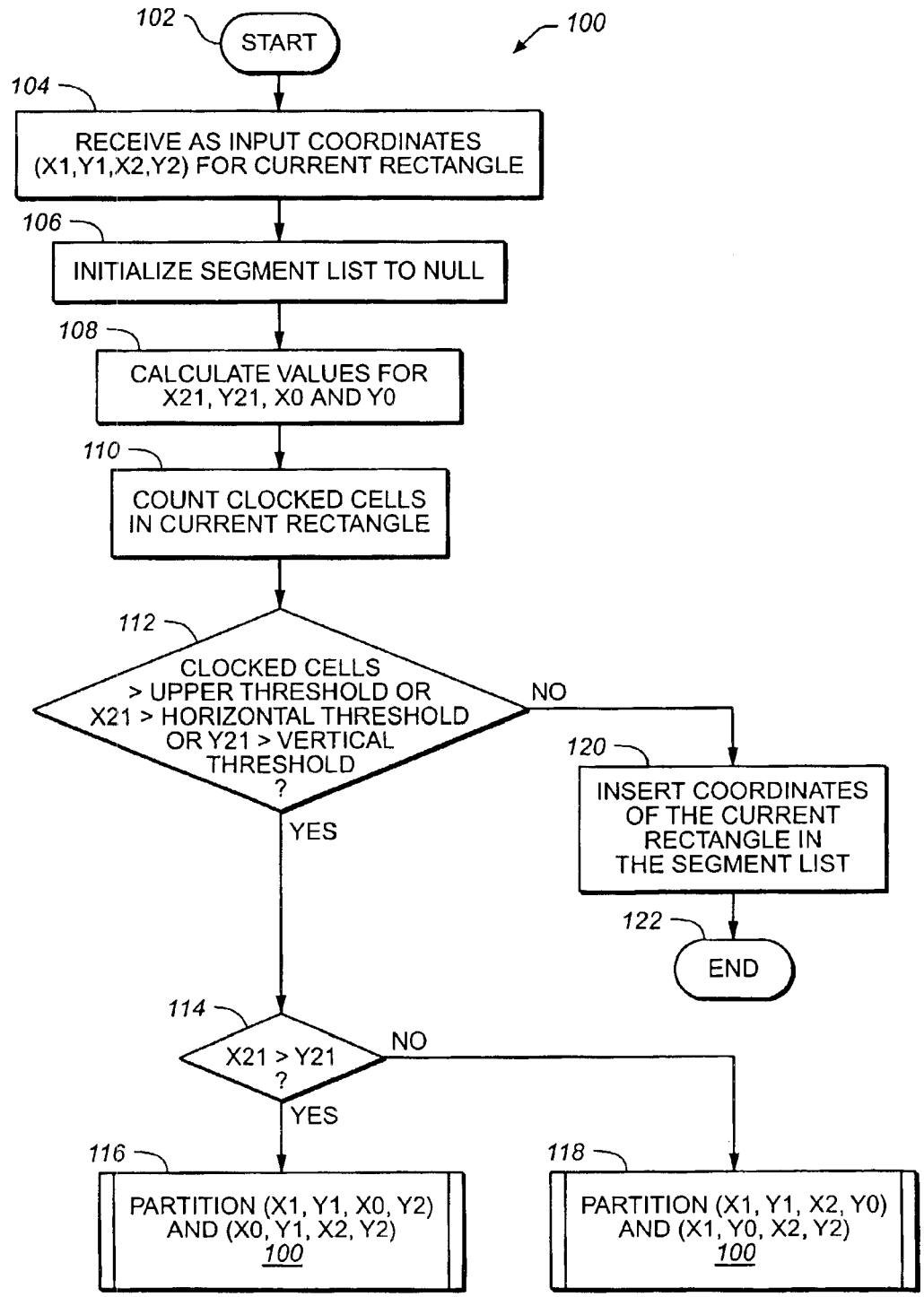
FIG._1

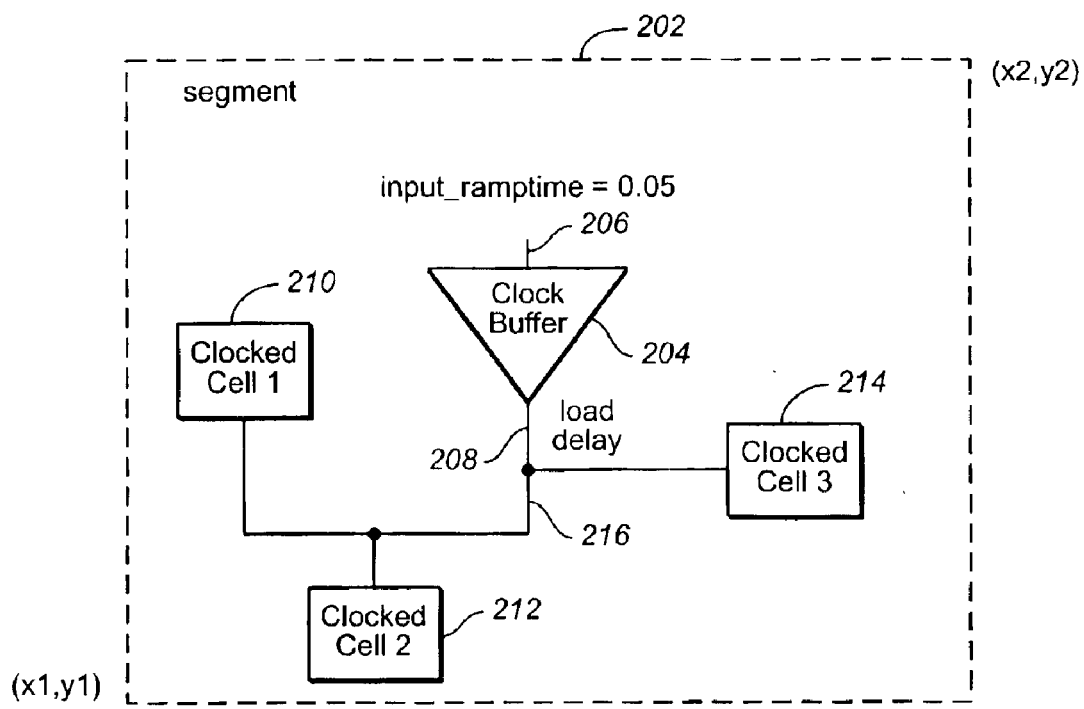
FIG._2
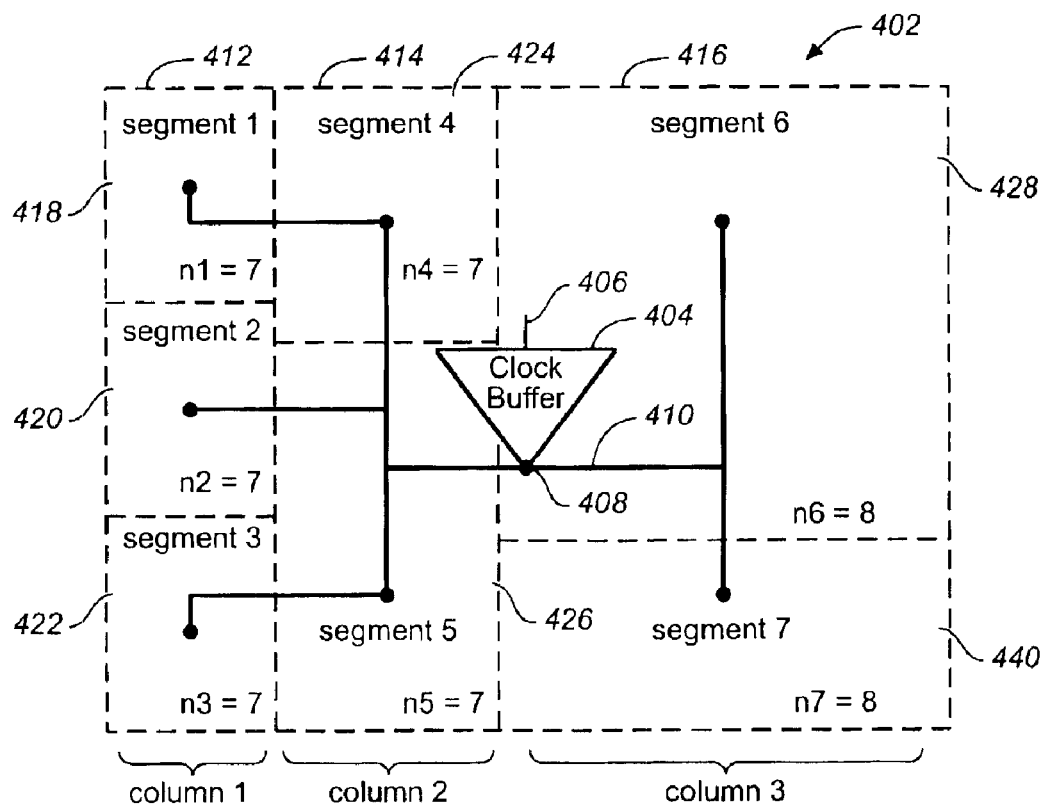
FIG._4

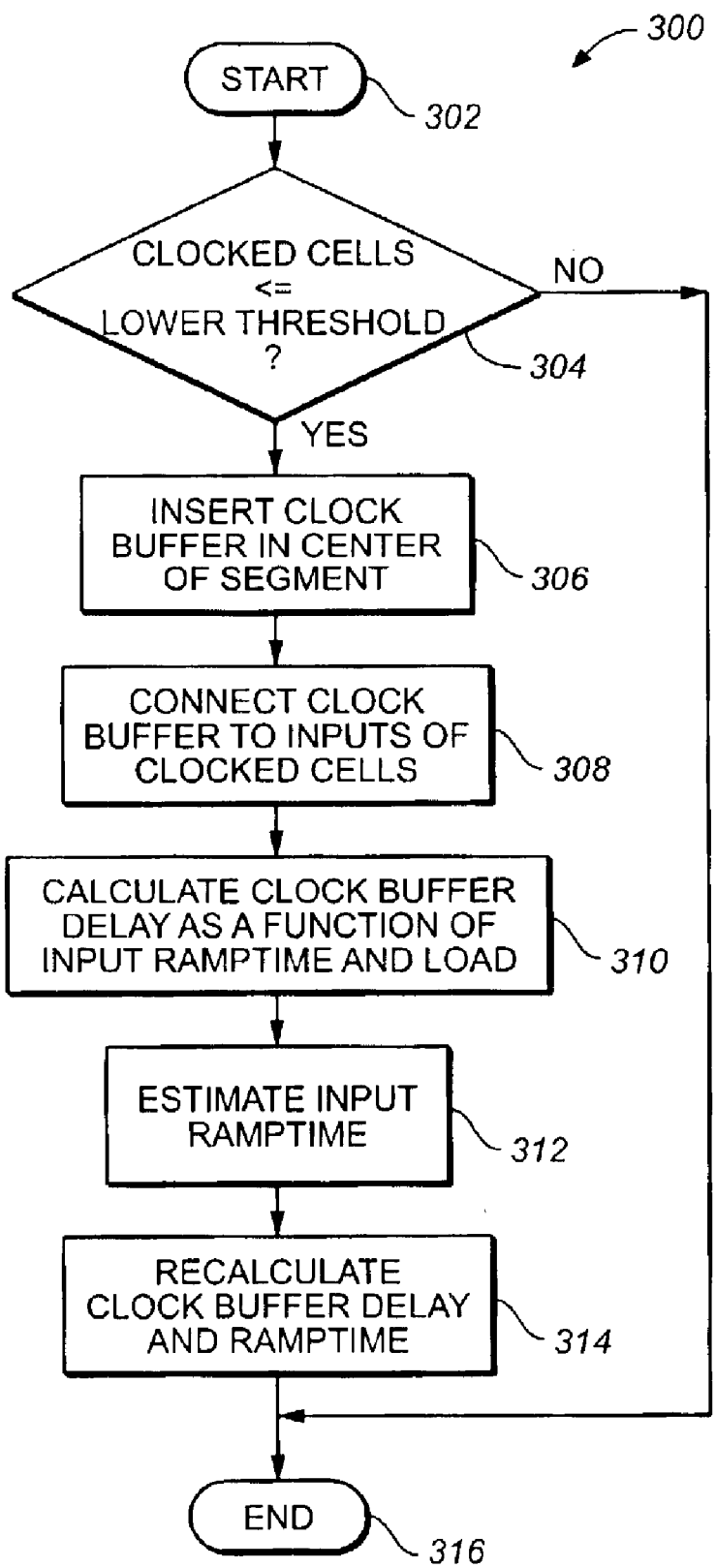
FIG._3

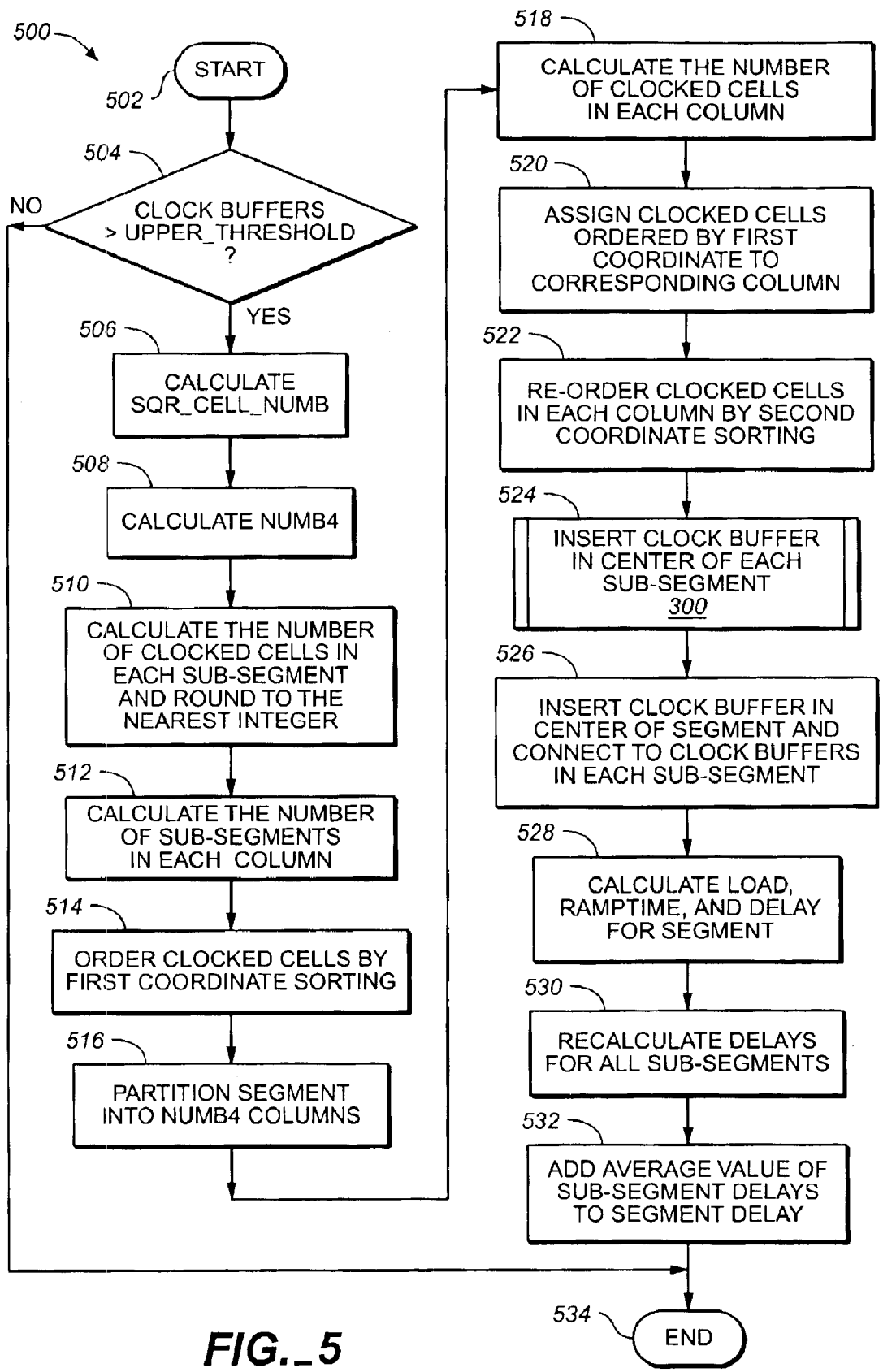
FIG._5

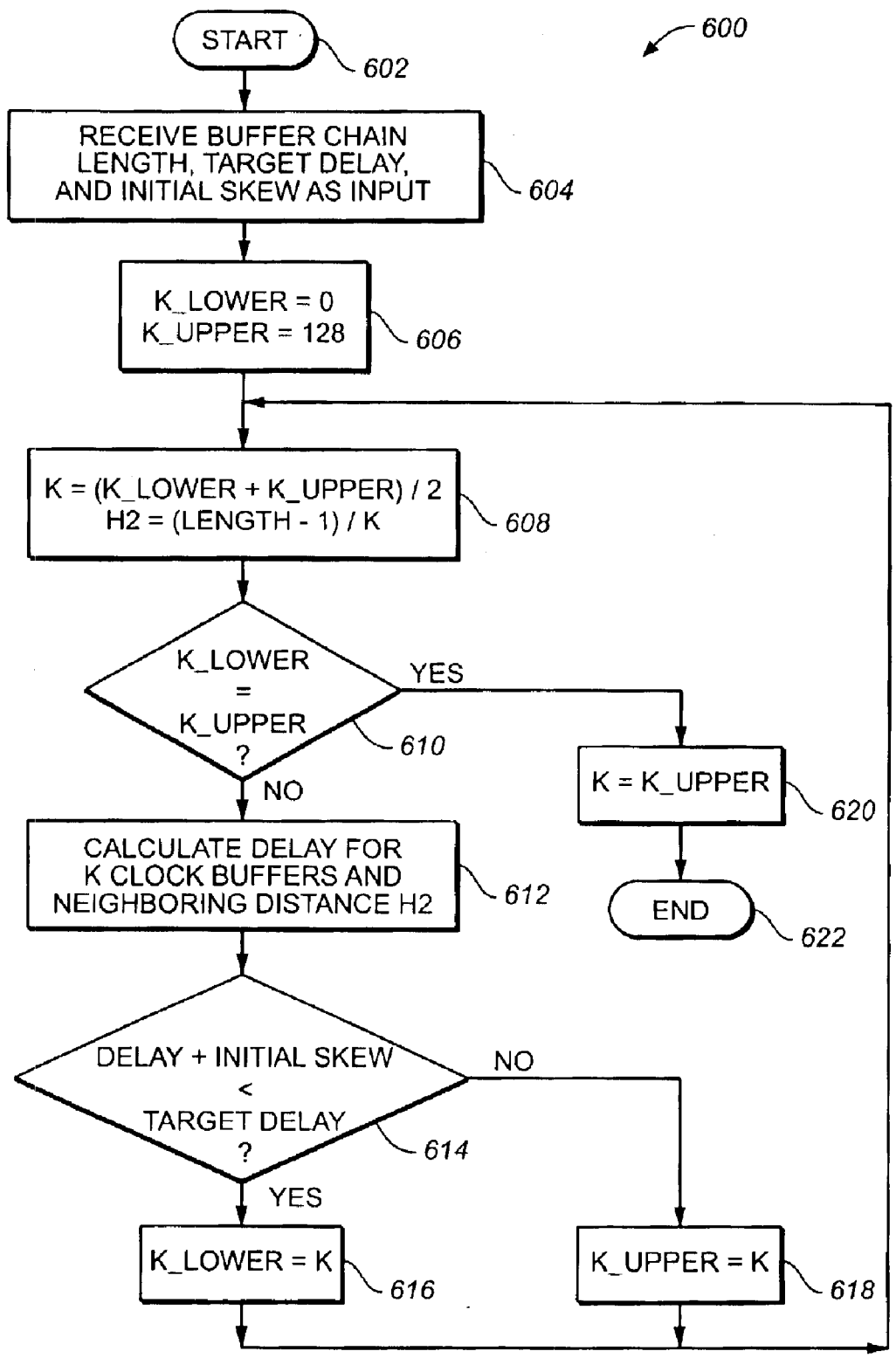
FIG._6

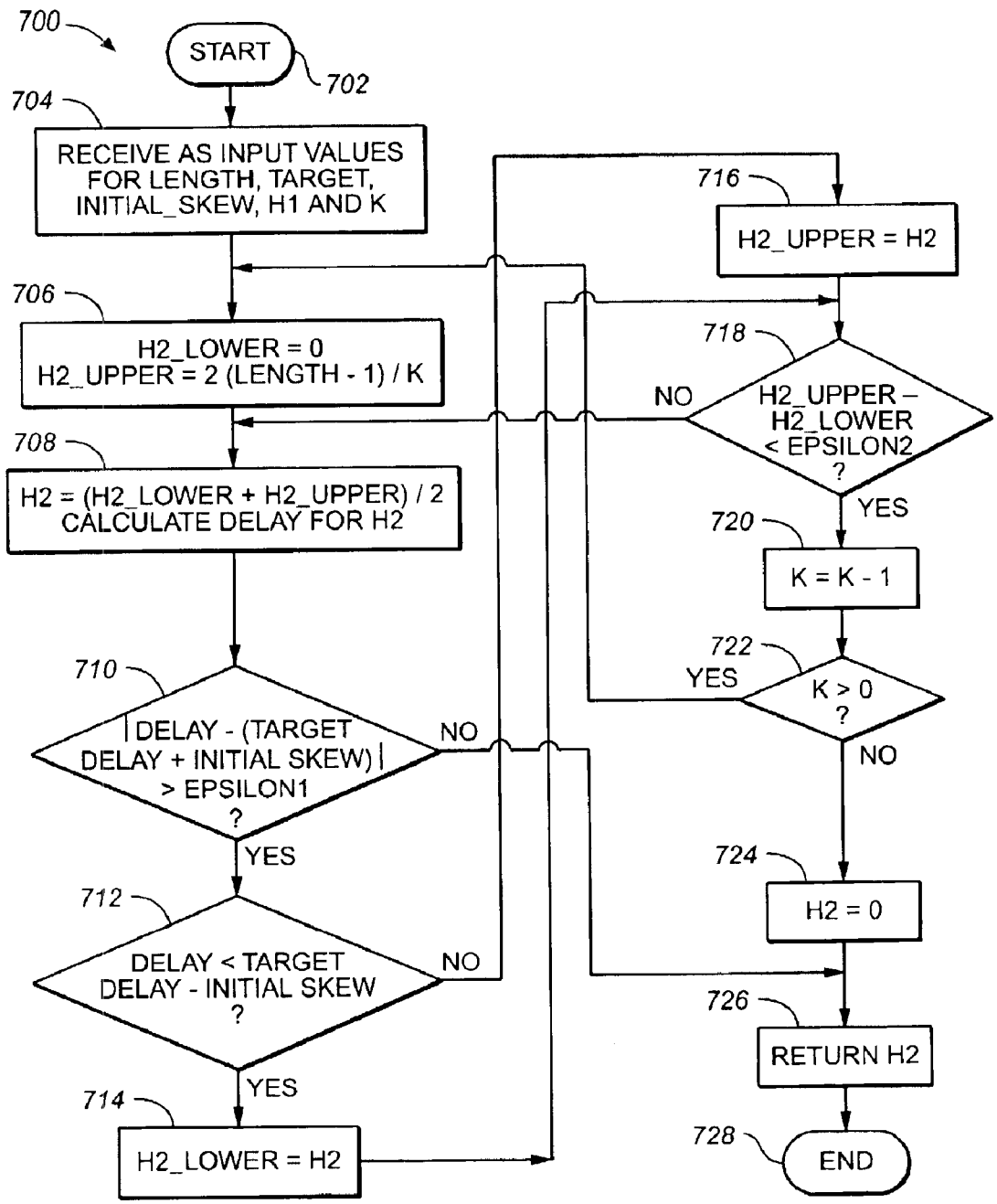
FIG._7

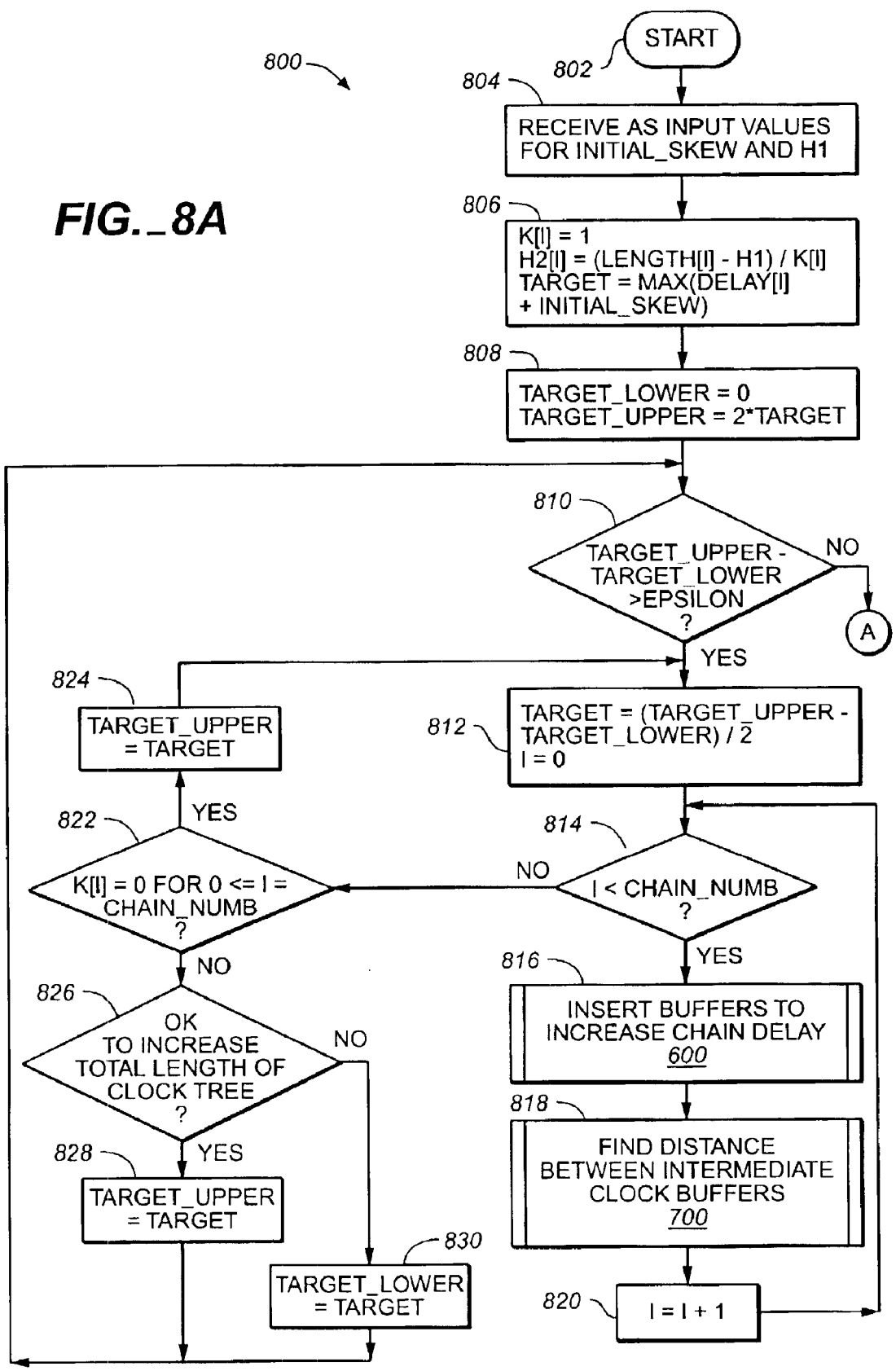
FIG._8A

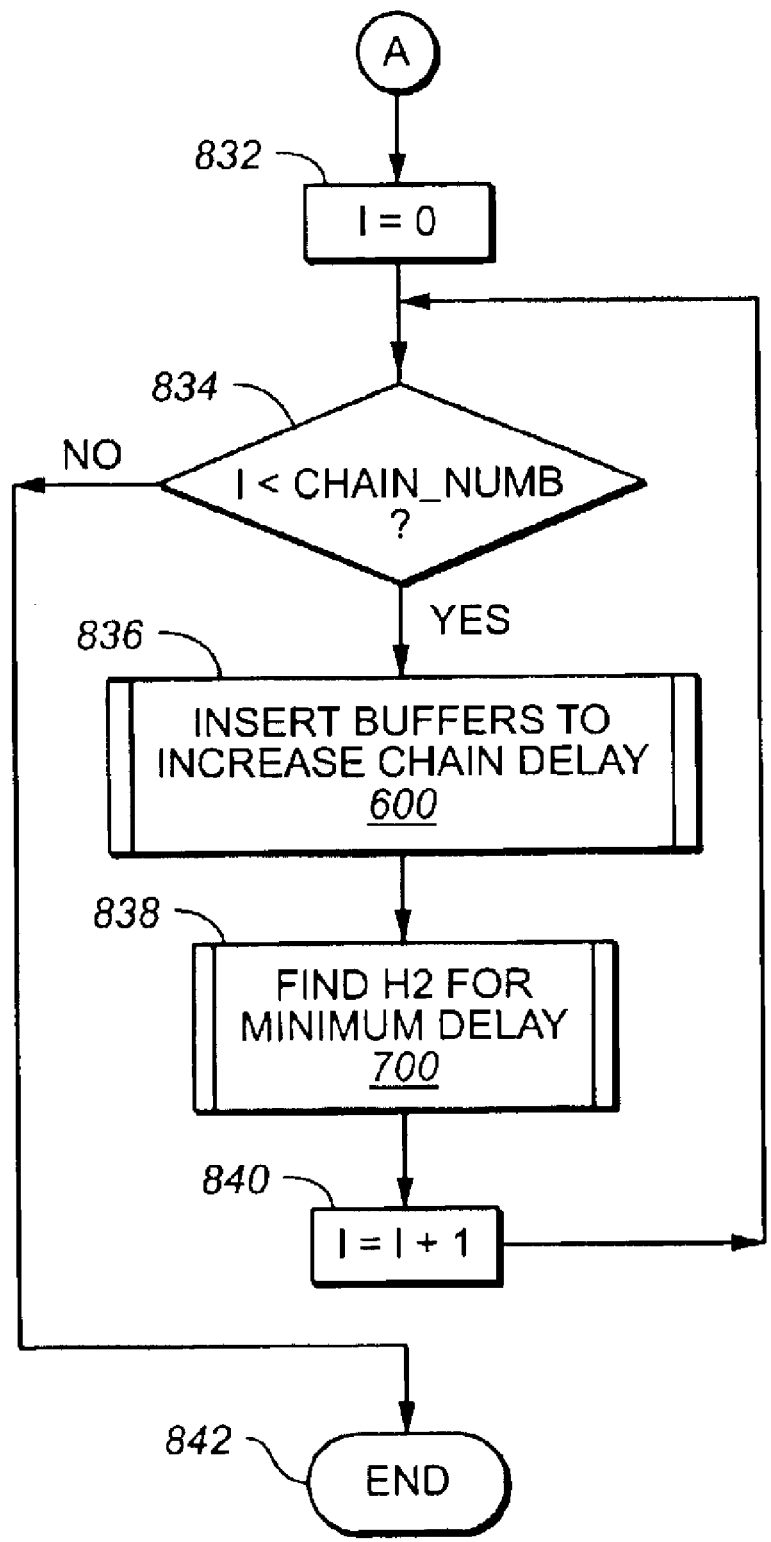
FIG._8B

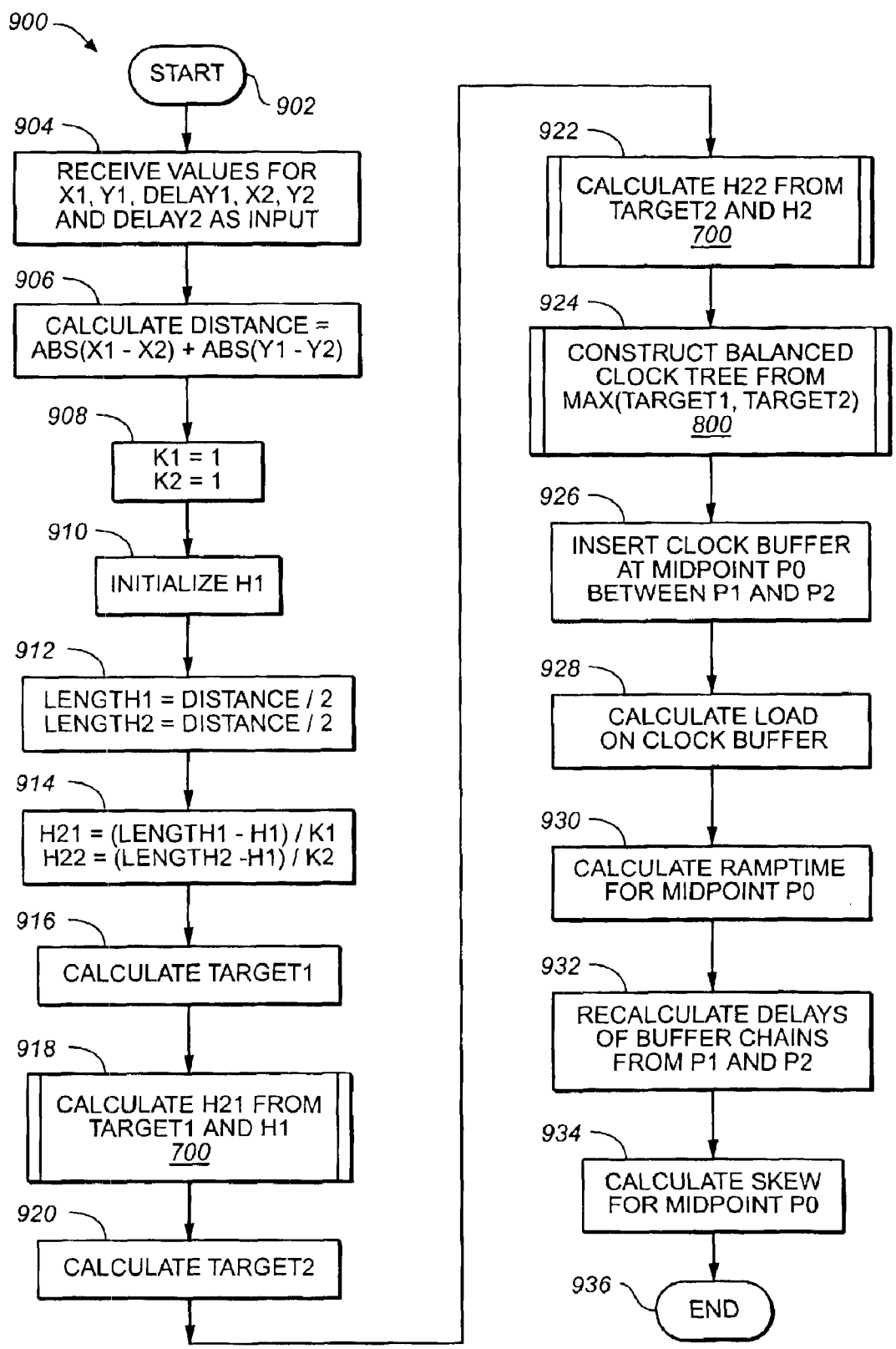
FIG._9

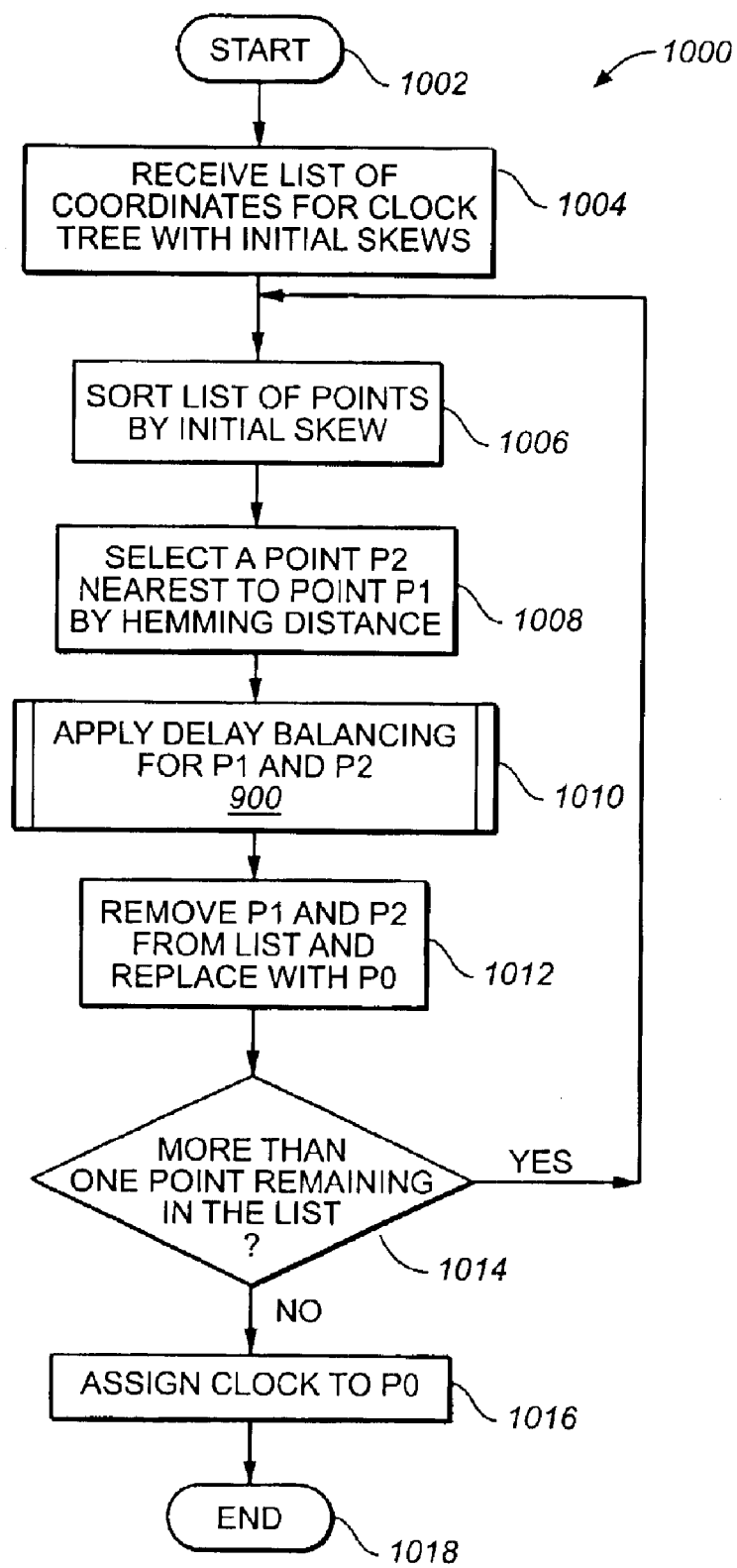
FIG._10

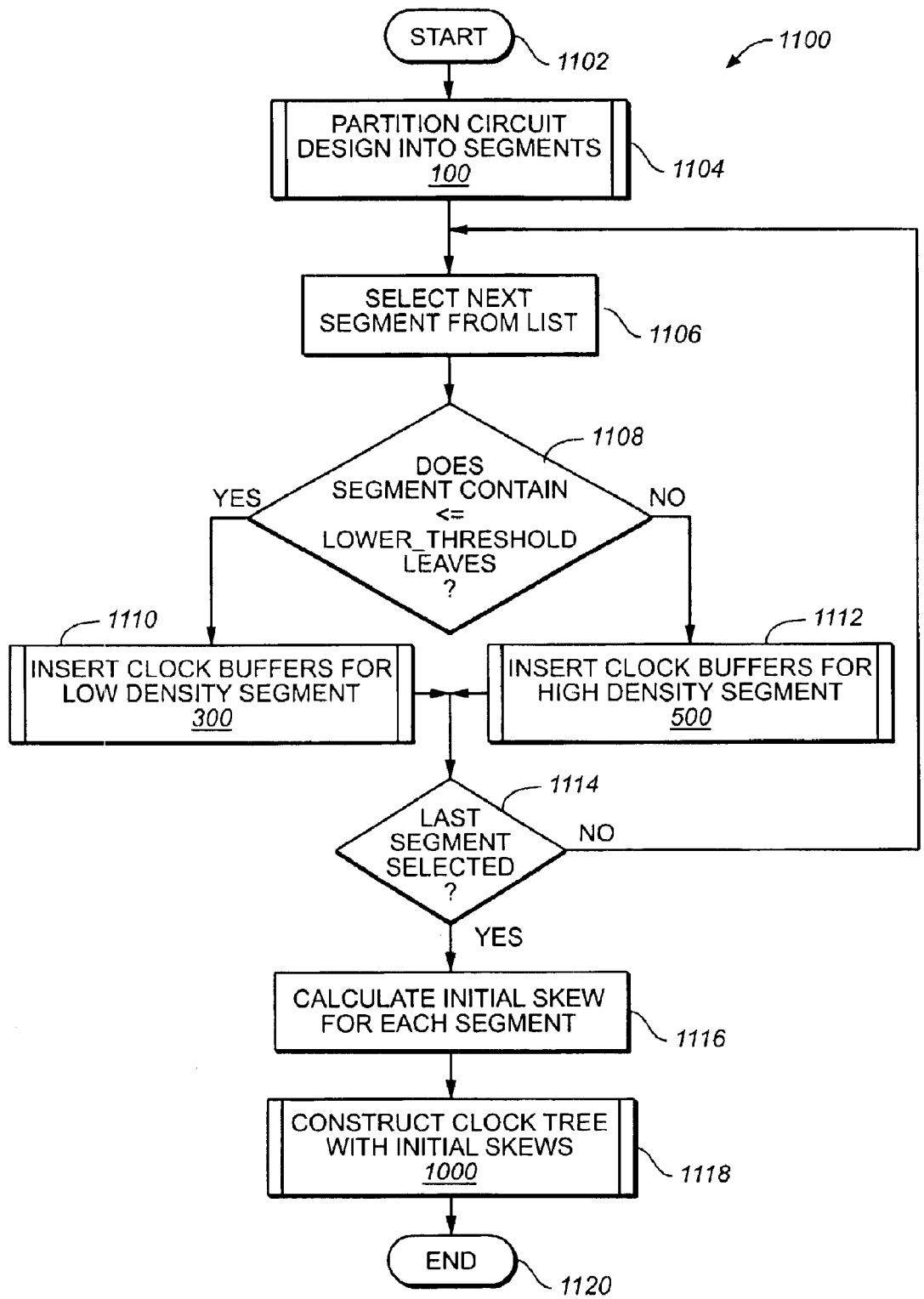
FIG._11

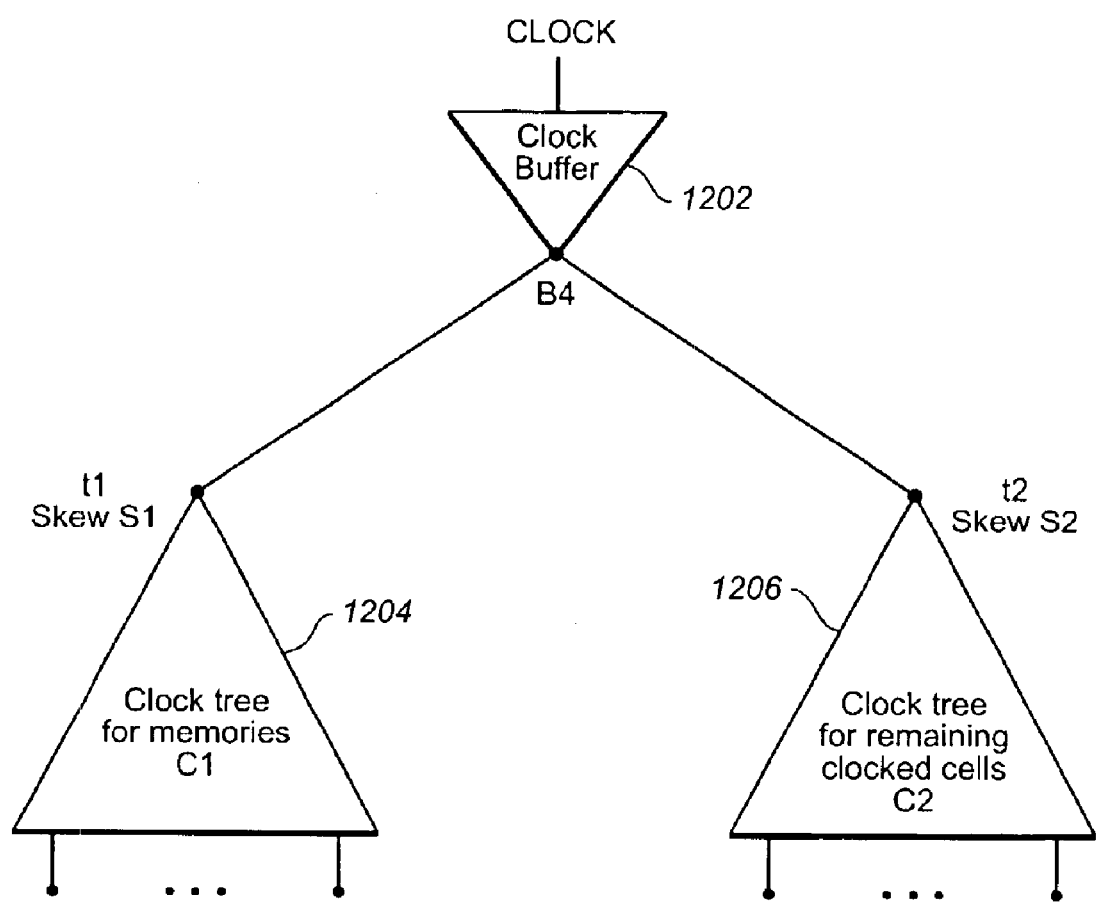
FIG._12

CLOCK TREE SYNTHESIS WITH SKEW FOR MEMORY DEVICES

CROSS REFERENCE TO RELATED APPLICATIONS

This patent application is related to U.S. patent application Ser. No. 09/885,589, for METHOD OF INTEGRATING CLOCK TREE SYNTHESIS AND TIMING OPTIMIZATION FOR AN INTEGRATED CIRCUIT DESIGN, filed Jun. 19, 2001, by Pavisic et al., incorporated herein by reference and assigned to the same assignee as the present invention. This application is related to U.S. patent application Ser. No. 09/822,969, for "EDITING PROTOCOL FOR FLEXIBLE SEARCH ENGINES", filed on Mar. 30, 2001, by Andreev, et al., incorporated herein by reference and assigned to the same assignee as the present invention; U.S. patent application Ser. No. 09/679,209 by Andreev, et. al for "FAST FLEXIBLE SEARCH ENGINE FOR LONGEST PREFIX MATCH" filed on Oct. 4, 2000, incorporated herein by reference and assigned to the same assignee as the present invention; and U.S. patent application Ser. No. 09/679,313 by Andreev, et al. for "FLEXIBLE SEARCH ENGINE HAVING SORTED BINARY SEARCH TREE FOR PERFECT MATCH", filed on Oct. 4, 2000, incorporated herein by reference and assigned to the same assignee as the present invention.

BACKGROUND OF THE INVENTION

The present invention is directed to methods for synthesizing balanced clock trees for an integrated circuit design. More specifically, but without limitation thereto, the present invention is directed to partitioning a clock tree into two clock trees, one for memory devices and another for the remaining devices in the integrated circuit design.

As the number of memories increases in integrated circuit designs, the problem of peak instantaneous power becomes increasingly important. Voltage drop due to the peak power demand from simultaneous switching of a large number of memory devices can result in a malfunction in the operation of the integrated circuit.

SUMMARY OF THE INVENTION

In one aspect of the present invention, a method of synthesizing a clock tree for reducing peak power in an integrated circuit design includes partitioning a circuit design into a set of memory cells and a set of non-memory cells, constructing a first clock tree having a first root vertex with a corresponding initial skew for the set of memory cells, constructing a second clock tree having a second root vertex with a corresponding initial skew for the set of non-memory cells, delay balancing the first root vertex and the second vertex clock tree, and inserting a clock buffer between the first root vertex and the second root vertex.

DESCRIPTION OF THE DRAWINGS

The present invention is illustrated by way of example and not limitation in the accompanying figures, in which like references indicate similar elements throughout the several views of the drawings, and in which:

FIG. 1 illustrates a flow chart of a method of partitioning a circuit design according to an embodiment of the present invention;

FIG. 2 illustrates an algorithm for inserting a clock buffer in a low-density segment for the method illustrated in FIG. 1;

FIG. 3 illustrates a flow chart for inserting a clock buffer in a low-density segment as illustrated in FIG. 2;

FIG. 4 illustrates an algorithm for inserting a clock buffer in a high-density segment for the method illustrated in FIG. 1;

FIG. 5 illustrates a flow chart for inserting a clock buffer in a high-density segment as illustrated in FIG. 4;

FIG. 6 illustrates a flow chart for increasing buffer chain delay by inserting additional clock buffers according to an embodiment of the present invention;

FIG. 7 illustrates a flow chart for changing the length of a buffer chain by adjusting the distance h2 between neighboring intermediate clock buffers according to an embodiment of the present invention;

FIGS. 8A and 8B illustrate a flow chart for constructing a balanced clock tree with initial skews according to an embodiment of the present invention;

FIG. 9 illustrates a flow chart for balancing the delay between two points for the method illustrated in FIG. 1;

FIG. 10 illustrates a flow chart for constructing a clock tree with initial skews for an arbitrary number of leaves according to an embodiment of the present invention;

FIG. 11 illustrates a flow chart for constructing a clock tree with improved skew for an arbitrary number of clocked cells without initial skews in accordance with an embodiment of the present invention; and FIG. 12 illustrates a method of synthesizing a clock tree for the entire circuit design according to an embodiment of the present invention.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

In traditional methods of clock tree synthesis, a clock signal is delivered to all sequential circuit elements, for example, flip-flops and memory devices, at substantially the same time. An example of a computer program implementing such a method is Avant! Gated Clock Tree Synthesis (GCTS). For circuits having a large number of memory cells, a significant voltage drop may occur due to the simultaneous switching of the memory cells. Some methods of clock tree synthesis purposely skew the clock signal so that some of the sequential circuit elements receive the same clock signal at different times to satisfy timing constraints such as set up and hold times. An example of a computer program implementing such a method, also called a useful skew approach, is Clockwise, available from Celestry Design Technologies, Inc. In the present invention, two clock trees are constructed. The first clock tree skews the clock signal to arrive at different memory cells at different times to distribute the power usage uniformly over the clock period. As a result, the peak power for the memory circuits is reduced to substantially the peak power of a single memory cell plus the standby power required for the remaining memory cells. Although memory cells are used in this example, other embodiments may advantageously reduce peak power for circuit designs that include any type of clocked cells that are clocked simultaneously in large numbers. The second clock tree for the remaining non-memory clocked cells may be constructed using conventional methods or by a balancing algorithm of the present invention.

In one aspect of the present invention, a method of synthesizing a clock tree for reducing peak power in an integrated circuit design includes partitioning a circuit design into a set of memory cells and a set of non-memory cells, constructing a first clock tree having a first root vertex with a corresponding initial skew for the set of memory cells, constructing a second clock tree having a second root vertex with a corresponding initial skew for the set of non-memory cells, delay balancing the first root vertex and the second vertex clock tree, and inserting a clock buffer between the first root vertex and the second root vertex.

In one embodiment, a clock tree is partitioned into two clock trees, one for memory devices and the other for the remaining sequential circuit elements in an integrated circuit design. The first clock tree for the memory devices is constructed according to an embodiment of the present invention so that the clock signals arrive at different times, also referred to as clock skew. The clock skew distributes power usage uniformly over a clock cycle, so that the peak instantaneous power is substantially equal to the average power. The second clock tree for the remaining sequential circuit elements may be constructed according to traditional methods. Alternatively, the second clock tree may be constructed using a balancing algorithm.

The purpose of clock tree synthesis is to distribute a clock signal to every clocked, or sequential, circuit element on an integrated circuit die. The difference in arrival time of the clock signal between two circuit elements, or cells, on the same clock net is called clock skew. If the clock skew is zero for two memory cells, then the peak power requirement for the two memory devices is double that required for a single memory cell. The peak power requirement may be reduced by introducing a clock skew so that each memory cell receives the clock signal at a different time during the clock cycle.

In one embodiment of a method according to the present invention, a set of core algorithms is used to synthesize a clock tree for memory cells and a clock tree for the remaining clocked cells.

One of the core algorithms, S(x1, y1, x2, y2), partitions the circuit design into rectangular segments. To construct a two-level clock tree with no ramptime violations, the number of edges from each vertex in the clock tree cannot exceed a lower threshold of, for example, 9 or 10. The two-level clock tree for this example has a root vertex and 9 or 10 vertices at most in the first level. The second level has at most a number of vertices/leaves (clocked cells) equal to the square of the lower threshold, in this example, 81 to 100 vertices/leaves. The square of the lower threshold defines the upper threshold. Each of the rectangular segments satisfies three constraints:

(1) the number of clocked cells in the segment does not exceed the upper threshold;

(2) the width of the rectangle does not exceed a horizontal threshold, for example 0.3 mm (in this case the wire length is small enough so that net delay is not significant); and (3) the height of the rectangle does not exceed a vertical threshold, for example 0.3 mm.

The coordinates of each of the rectangular segments that satisfy all three of the constraints defined above may be found, for example, by performing the following steps:

(a) receiving as input a rectangle defined by the coordinates (x1, y1, y2, y2) enclosing a circuit design core, or outline;

(b) initializing a segment list to null, that is, empty;

(c) if the current rectangle contains more clocked cells than the upper threshold, or if x21=x2−x1 is greater than the horizontal threshold, or if y21=y2−y1 is greater than the vertical threshold, then control is transferred to step (d); otherwise control is transferred to step (f);

(d) partitioning the current rectangle into two rectangles having equal area according to the following formulas:

$$x21=x2-x1$$
$$y21=y2-y1$$
$$x0=(x1+x2)/2$$
$$y0=(y1+y2)/2 \quad (1)$$

If x21 is greater than y21, then the two rectangles are defined by the coordinates (x1, y1, x0, y2) and (x0, y1, y2, y2). If x21 is less than or equal to y21, then the two rectangles are defined by the coordinates (x1, y1, y2, y0) and (x1, y0, y2, y2);

(e) inserting the two rectangles into a recursion list and transferring control to step (g);

(f) if all three of the constraints in step (c) are satisfied, then the coordinates of the current rectangle are inserted into the segment list for each segment in the partition of the circuit design;

(g) the next rectangle in the recursion list is selected as the current rectangle;

(h) the current rectangle is deleted from the recursion list and control is transferred to step (c) until the recursion list is empty;

(i) the segment list now contains a list of coordinates for a number of rectangular segments constituting the circuit design wherein each of the segments satisfies all three constraints given in step (c), and the procedure is terminated.

FIG. 1 illustrates a flow chart 100 for partitioning a circuit design according to an embodiment of the present invention.

Step 102 is the entry point of the flow chart 100.

In step 104, the values of the coordinates (x1, y1, y2, y2) are received as input to define the current rectangle. Initially, the values are those of the rectangle defining the entire circuit design. These values are replaced during recursive calls to the partitioning algorithm as described in greater detail below.

In step 106, a segment list defining the partitioning of the circuit design is initialized to null, that is, empty.

In step 108, the values for x21, y21, x0, and y0 are calculated according to the formulas (1) above.

In step 110, the number of clocked cells enclosed within the current rectangle is counted in an arbitrary order from the cell list corresponding to the current rectangle.

In step 112, if the current rectangle contains more clocked cells than the upper threshold, or if x21=x2−x1 is greater than the horizontal threshold, or if y21=y2−y1 is greater than the vertical threshold, then control is transferred to step 112; otherwise control is transferred to step 118;

In step 114, if x21 is greater than y21, then control is transferred to step 116. Otherwise, control is transferred to step 120.

In step 116, the partitioning algorithm is called recursively with the new coordinate values (x1, y1, x0, y2) and (x0, y1, y2, y2) for the two rectangles partitioned from the current rectangle. That is, the current values of x1, y1, y2, y2, x21, y21, x0, and y0 are saved, and the partitioning algorithm is called recursively with the new coordinate values (x1=x1, y1=y1, x2=x0, y2=y2). When control returns, the current values of x1, y1, y2, y2, x0, and y0 are restored, and the partitioning algorithm is called recursively again with the new coordinate values (x1=x0, y1=y1, x2=y2, y2=y2).

In step 118, the partitioning algorithm is called recursively with the values (x1, y1, y2, y0) and (x1, y0, y2, y2) for the two rectangles partitioned from the current rectangle. That is, the current values of x1, y1, y2, y2, x21, y21, x0, and y0 are saved, and the partitioning algorithm is called recursively with the new coordinate values (x1=x1, y1=y1, x2=y2, y2=y0). When control returns, the current values of x1, y1, y2, y2, x0, and y0 are restored, and the partitioning algorithm is called recursively again with the new coordinate values (x1=x1, y1=y0, x2=y2, y2=y2).

In step 120, the values of the coordinates (x1, y1, y2, y2) for the current rectangle are inserted into the segment list. The recursion of the partitioning algorithm performed in steps 116 and 118 continues until the segment list contains the values of the coordinates for each segment in the partition of the circuit design satisfying all the constraints given by the formulas (1).

Step 122 is the exit point of the flow chart 100.

After calculating the coordinates of each segment in the partition of the circuit design satisfying all the constraints given by the formulas (1), clock buffers are inserted into the center of each segment as shown in FIGS. 2 and 3.

FIG. 2 illustrates an algorithm for inserting clock buffers in low-density segments in accordance with an embodiment of the present invention. Shown in FIG. 2 are a segment 202 defined by the coordinate values (x1, y1, y2, y2), a clock buffer 204, an input pin 206, an output pin 208, clocked cells 210, 212, and 214, and a clock net 216.

For each segment that contains no more than the number of clocked cells defined by the lower threshold, a clock buffer is inserted in the center of the segment and the output port of the clock buffer is connected to the clock inputs of all the clocked cells in the segment. The delay between the input pin 206 and the output pin 208 of the clock buffer 204 is calculated as a function of the input ramptime and the load represented by the clock net 216 connected to the clocked cells 210, 212, and 214. The input ramptime is estimated at 0.05 as a first approximation to calculate the delay and ramptime as a function of input ramptime and the load of the clock net, for example, by a model that combines a parabolic approximation model with a piecewise linear continuous model. The delay calculation function may be implemented as a lookup table from the model according to well known techniques. Once the input ramptime is determined, the delay and ramptime for the arc between the input pin 206 and the output pin 208 are recalculated. The ramptime depends highly on the load and does not change significantly when the input ramptime changes. An additional two buffers are inserted in each clock buffer chain to eliminate the influence of ramptime on the clock buffer input.

FIG. 3 illustrates a flow chart for inserting a clock buffer in a low-density segment as illustrated in FIG. 2.

Step 302 is the entry point for the flow chart 300.

In step 304, if the segment contains no more than the number of clocked cells defined by the upper threshold, then control is transferred to step 306. Otherwise, control is transferred to step 316.

In step 306, a clock buffer is inserted in the center of the segment.

In step 308, the output port of the clock buffer is connected to the clock inputs of all the clocked cells in the segment.

In step 310, the delay between the input pin and the output pin of the clock buffer is calculated as a function of the input ramptime and the load represented by the clock net connected to the clock inputs of the clocked cells in the segment.

In step 312, a trial value for the input ramptime is estimated at, for example, 0.05 as a first approximation to calculate the delay and ramptime.

In step 314, the delay and ramptime for the arc between the input pin and the output pin of the clock buffer are recalculated.

Step 316 is the exit point of the flow chart 300.

FIG. 4 illustrates an algorithm for inserting a clock buffer in a high-density segment for the method illustrated in FIG. 1. Shown in FIG. 4 are a segment 402, a clock buffer 404, an input pin 406, an output pin 408, a clock net 410, columns 412, 414, and 416, and sub-segments 418, 420, 422, 424, 426, 428, and 440.

For each segment that contains more than the number of clocked cells defined by the lower threshold, the square root of the number of clocked cells cell_numb in the segment is calculated, rounded to the nearest integer, and denoted by sqr_cell_numb. The square root of sqr_cell_numb is calculated, rounded to the nearest integer, and denoted by numb4.

A series containing sqr_cell_numb terms n1, n2, . . . is generated from the number of clocked cells cell_numb in the segment as follows:

$$n1 = \text{cell\_numb/sqr\_cell\_numb},$$

$$n2 = (\text{cell\_numb} - n1)/(\text{sqr\_cell\_numb} - 1),$$

$$n3 = (\text{cell\_numb} - n1 - n2)/(\text{sqr\_cell\_numb} - 2),$$

and so on. (2)

Each term in the series n1, n2, . . . is rounded to the nearest integer and denotes the number of clocked cells in the corresponding sub-segment. For example, n1 is equal to the number of clocked cells in sub-segment 418, n2 is equal to the number of clocked cells in the sub-segment 420, and so on. The sum of the series n1, n2, . . . is equal to cell_numb, and each term in the series has a value approximately equal to sqr_cell_numb.

A series r1, r2, . . . containing numb4 terms is generated from the number of clocked cells cell_numb in the segment as follows:

$$r1 = \text{sqr\_cell\_numb/numb4},$$

$$r2 = (\text{sqr\_cell\_numb} - r1)/(\text{numb4} - 1),$$

$$r3 = (\text{sqr\_cell\_numb} - r1 - r2)/(\text{numb4} - 2), \quad (3)$$

and so on. (3)

Each term in the series r1, r2, . . . is rounded to the nearest integer. The sum of the series r1, r2, . . . is equal to sqr_cell_numb, and each term in the series has a value approximately equal to numb4.

Next, the clocked cells in the segment are ordered by first coordinate sorting, that is, according to the x-coordinate of each clocked cell. For example, a clocked cell having a x-coordinate of 3 would be ordered between clocked cells having x-coordinates of 2 and 4, respectively.

In FIG. 4, each high-density segment is partitioned into numb4 columns. The number of clocked cells in each column is counted and denoted as cells4column[i], where i=1, 2, . . . numb4. The number of clocked cells in each column cells4column[i] is calculated as follows:

$$cells4column[i] = \sum_{k=rm+1}^{ri} nk \quad (4)$$

where m=i−1 and r0=0

For example, cells4column[1] is equal to the sum of the first r1 terms in the series n1, n2, . . . , cells4column [2] is equal to the sum of the next r2 terms, and so on. Each of the terms in the series r1, r2, . . . denotes the number of rows, or sub-segments, in each corresponding $i^{th}$ column. In this example, r1 is equal to the number of rows in the first column 412, r2 is equal to the number of rows in the second column 414, and so on.

The first cells4column [1] clocked cells in the ordered list of clocked cells sorted by first coordinate are assigned to column 412, the next cells4column [2] clocked cells in the ordered list are assigned to column 414, and so on.

In the example illustrated in FIG. 4, performing the calculations described in formulas (2), (3), and (4) yield the results shown in Table 1 below:

TABLE 1

| | |
|---|---|
| cell_numb | 51 |
| sqr_cell_numb | 7 |
| numb4 | 3 |
| n1 | 7 |
| n2 | 7 |
| n3 | 7 |
| n4 | 7 |
| n5 | 7 |
| n6 | 8 |
| n7 | 8 |
| r1 | 3 |
| r2 | 2 |
| r3 | 2 |
| cells4column[1] = n1 + n2 + n3 | 21 |
| cells4column[2] = n4 + n5 | 14 |
| cells4column[3] = n6 + n7 | 16 |

The clocked cells in each column are then re-ordered by second coordinate sorting, that is, according to the y-coordinate of each clocked cell. For example, a clocked cell having a y-coordinate of 5 would be ordered between clocked cells having y-coordinates of 4 and 6, respectively. The first sub-segment 418 then contains the first n1 clocked cells in the re-ordered list for the first column 412, the second sub-segment 420 contains the next n2 clocked cells in the re-ordered list, and so on.

For each sub-segment 418, 420, 422, 424, 426, 428, and 440, the algorithm described above with regard to FIG. 2 for inserting clock buffers in low-density segments is performed. A clock buffer 404 is inserted in the center of the segment 402 and is connected by the clock net 410 to the clock buffers inserted by the algorithm for inserting clock buffers in low-density segments located in the center of each of the sub-segments 418, 420, 422, 424, 426, 428, and 440. The load, ramptime, and delay for the output pin 408 are then calculated according to well known techniques. All delays are then recalculated for the sub-segments using the resulting ramptime. The average value of the sub-segment delays is added to the delay of the segment.

FIG. 5 illustrates a flow chart 500 for inserting clock buffers in a high-density segment as illustrated in FIG. 4.

Step 502 is the entry point of the flow chart 500.

In step 504, if the segment contains more than the number of clocked cells defined by the upper threshold, then control transfers to step 506. Otherwise, control is transferred to step 534.

In step 506, the square root of the number of clocked cells cell_numb in the segment is calculated, rounded to the nearest integer, and denoted by a first integer sqr_cell_numb.

In step 508, the square root of sqr_cell_numb is calculated, rounded to the nearest integer, and denoted by a second integer numb4.

In step 510, a series containing sqr_cell_numb terms n1, n2, . . . is generated according to the formulas (2) and rounded to the nearest integer. Each of the terms in the series n1, n2, . . . denotes the number of clocked cells in the corresponding i-th sub-segment.

In step 512, a series r1, r2, . . . containing numb4 terms is generated from the number of clocked cells cell_numb in the segment according to the formulas (3) and rounded to the nearest integer. Each of the terms in the series r1, r2, . . . denotes the number of rows, or sub-segments, in each column of the segment.

In step 514, the clocked cells in the segment are ordered by first coordinate sorting as describe above.

In step 516, the segment is partitioned into numb4 columns.

In step 518, the number of clocked cells in each column cells4column [i], where i=1, 2, . . . numb4, is calculated according to the formula (4).

In step 520, the number of clocked cells in the ordered list sorted by first coordinate corresponding to the number of clocked cells in each column is assigned to the corresponding i-th column.

In step 522, the clocked cells in each column are re-ordered by second coordinate sorting as described above.

In step 524, the algorithm for inserting buffers described with regard to FIG. 3 is applied for each sub-segment.

In step 526, a clock buffer is inserted in the center of the segment and connected to the input pins of the clock buffers in all the sub-segments.

In step 528, the load, ramptime, and delay of the output pin of the clock buffer inserted in step 526 is calculated as the segment delay.

In step 530, the delays are recalculated for all the sub-segments using the resulting ramptime.

In step 532, the average value of the sub-segment delays is added to the segment delay.

Step 534 is the exit point of the flow chart 500.

FIG. 6 illustrates a flow chart for increasing buffer chain delay in accordance with an embodiment of the present invention by inserting additional clock buffers between the origin of the clock signal and the clocked cell, or leaf, at the end of the buffer chain to achieve the target delay. The clock buffer chain contains two additional clock buffers, a first clock buffer at the end of the buffer chain and a second clock buffer at a distance h1 from the end of the clock buffer chain. The distance between intermediate neighboring clock buffers is denoted by the variable h2.

Step 602 is the entry point of the flow chart 600.

In step 604, values for the length of a buffer chain length, a target delay target, and initial skew initial_skew for a buffer chain are received as input. The length of the buffer chain may be expressed in absolute or relative units. For example, the length may be expressed in absolute units of microns or in relative grid units used in the circuit design floorplan. The grid unit may be assigned to different absolute lengths corresponding to various semiconductor technologies in which the circuit design is to be implemented without having to re-enter the length values for each new semiconductor technology. The target delay is the desired delay required to meet the timing constraints of the circuit design. The initial skew is the delay that would result at the leaf, that is, the clocked cell at the end of the buffer chain, with no additional buffers. The output of the algorithm is the number of additional buffers needed to achieve the target delay.

In step 606, a variable k_lower is initialized to zero and a variable k_upper is initialized to a trial value, for example, 128. Different trial values of k_upper may be used to suit various applications that may require more or fewer additional clock buffers.

In step 608, a trial value for the number of additional clock buffers k is set equal to (k_lower+k_upper)/2 and h2 is set equal to (length−1)/k.

In step 610, if k_lower is equal to k_upper−1, then control is transferred to step 620. Otherwise, control is transferred to step 612.

In step 612, the delay is calculated for the trial number k of additional clock buffers and the neighboring distance h2 according to well known techniques.

In step 614, if the delay plus the initial skew is less than the target delay, then control is transferred to step 616. Otherwise, control is transferred to step 618.

In step 616, k_lower is set equal to k to increase the value of k, and control is transferred to step 608.

In step 618, k_upper is set equal to k to decrease the value of k, and control is transferred to step 608.

In step 620, k_upper is returned as the number of additional clock buffers to insert in the clock buffer chain.

Step 622 is the exit point of the flow chart 600.

FIG. 7 illustrates a flow chart for adjusting the length of a buffer chain in accordance with an embodiment of the present invention by increasing the distance h2 between neighboring intermediate clock buffers to achieve a desired target delay. The clock buffer chain contains two additional clock buffers, a first clock buffer at the end of the buffer chain and a second clock buffer at a distance h1 from the end of the clock buffer chain. The distance between intermediate neighboring clock buffers is denoted by the variable h2.

Step 702 is the entry point of the flow chart 700.

In step 704, the values for length, target, and initial_skew, h1, and the number of intermediate buffers k are received as input.

In step 706, the variable h2_lower is initialized to zero, and the variable h2_upper is initialized to 2(length−h1)/k.

In step 708, the value of h2 is set equal to (h2_lower+h2_upper)/2 to generate a trial value of h2, and the delay of the buffer chain is calculated for the trial value of h2.

In step 710, if the absolute value of the difference between the delay and the target delay plus the initial skew is greater than a first limit epsilon1, for example, 0.001 ns, then control is transferred to step 712. Otherwise, control is transferred to step 726.

In step 712, if the delay is less than the target delay minus the initial skew, then control is transferred to step 714. Otherwise, control is transferred to step 716.

In step 714, h2_lower is set equal to h2 to increase the value of h2, and control is transferred to step 718.

In step 716, h2_upper is set equal to h2 to decrease the value of h2, and control is transferred to step 718.

In step 718, if h2_upper minus h2_lower is less than a second limit epsilon2, for example, 0.00001 mm, then control is transferred to step 720. Otherwise, control is transferred to step 708.

In step 720, k is set equal to k−1 to delete one of the intermediate clock buffers so that h2 may be further increased.

In step 722, if k is greater than zero, control is transferred to step 706 to begin a new iteration of trial values for h2. Otherwise, control is transferred to step 724.

In step 724, h2 is set to zero.

In step 726, h2 is returned as the new distance between neighboring intermediate clock buffers for a balanced clock buffer chain.

Step 728 is the exit point of the flow chart 700.

FIGS. 8A and 8B illustrate a flow chart 800 for constructing a balanced clock tree with initial skews for the method illustrated in FIG. 1. Each clock buffer chain in the clock tree contains two additional clock buffers, a first clock buffer at the end of the buffer chain and a second clock buffer at a distance h1 from the end of the clock buffer chain. The distance h1 is the same for each clock buffer chain in the clock tree. The array of distances between intermediate neighboring clock buffers for all the clock buffer chains is denoted by H2, and K is the array of the number of intermediate clock buffers for all the clock buffer chains in the clock tree.

Step 802 is the entry point of the flow chart 800.

In step 804, the values for initial_skew and h1 are received as input.

In step 806, K[i] is initialized, for example, to 1, that is, the number of intermediate clock buffers in each clock buffer chain in the clock tree starts with a value of one, although other values may be used to suit specific applications; H2[i] is initialized to (Length[i]−h1)/K[i]; and the target delay target is initialized to the maximum value of (delay[i]+initial_skew[i]), where 0≦i<chain_numb, delay[i] is the calculated total delay of the i-th chain, and chain_numb equals the number of chains for balancing.

In step 808, the variable target_lower is initialized to zero, and the variable target_upper is initialized to 2*target.

In step 810, if target_upper minus target_lower is greater than a limit epsilon, for example, 0.001 ns, then control is transferred to step 812. Otherwise, control is transferred to step 832.

In step 812, target is set equal to (target_upper−target_lower)/2 and i is set equal to zero.

In step 814, if i is less than chain_numb, then control is transferred to step 816. Otherwise, control is transferred to step 822.

In step 816, the algorithm for inserting buffers described with regard to FIG. 6 is applied to the clock buffer chain i to find K[i].

In step 818, the algorithm for changing the distance h2 between neighboring intermediate clock buffers described with regard to FIG. 7 is applied to the clock buffer chain i to find H2[i].

In step 820, i is incremented by one, and control is transferred back to step 814.

In step 822, if K[i]=0 for 0≦i<chain_numb, that is, if there are any unbalanced chains in the clock tree, then the buffer chain i cannot be balanced by the current value of the target delay, and control is transferred to step 824 to increase the value of target. Otherwise, control is transferred to step 826.

In step 824, target_lower is set equal to target, and control is transferred back to step 812.

In step 826, if a change in the total length of the clock tree is permissible, for example, 0.5 mm, then control is transferred to step 828. Otherwise, control is transferred to step 830. For a given K[i], H2[i], and chain index i, (length[i]−(h1+K[i]*H2[i])) is added to the real change of length for all chains. Initially, the real change of length equals zero. If the real change of length is less than the permitted length change, the change is calculated for all K[i] and H2[i].

In step 828, the target delay is decreased by setting target_upper equal to target, and control is transferred back to step 810.

In step 830, the target delay is increased by setting target_lower equal to target, and control is transferred back to step 810.

In step 832, i is set equal to zero.

In step 834, if i<chain_numb, then control is transferred to step 836. Otherwise, control is transferred to step 842.

In step 836, the algorithm for inserting buffers described with regard to FIG. 6 is applied to find K[i] for the minimum acceptable value of the target delay.

In step 838, the algorithm for changing the distance h2 between neighboring intermediate clock buffers described with regard to FIG. 7 is applied to the clock buffer chain i to find H2[i] for the minimum acceptable value of the target delay.

In step 840, i is incremented by one, and control is transferred back to step 836.

Step 842 is the exit point of the flow chart 800.

FIG. 9 illustrates a flow chart 900 for balancing the delay between two points for the method illustrated in FIG. 1. The first point p1(x1, y1) has an initial skew delay delay1, and the second point p2(y2, y2) has an initial skew delay delay2. This algorithm constructs a clock tree with balanced delay between leaves p1 and p2 and accepts initial skews at both points.

Step 902 is the entry point of the flow chart 900.

In step 904, the values of the coordinates (x1, y1) of the first point p1, the value of the corresponding initial skew delay delay1, the values of the coordinates (y2, y2) of the first point p2, and the value of the corresponding initial skew delay delay2 is received as input.

In step 906, the Hemming (or Manhattan) distance between points p1 and p2 is calculated according to the formula:

$$\text{distance}=\text{abs}(x1-x2)+\text{abs}(y1-y2) \quad (5)$$

In step 908, a variable k1 representing the number of intermediate clock buffers in the buffer chain between the root of the clock tree and the leaf p1 is set equal to one, and a variable k2 representing the number of intermediate clock buffers in the buffer chain between the root of the clock tree and the leaf p2 is set equal to one.

Each buffer chain connecting the root of the clock tree to the leaves p1 and p2 also includes two additional buffers. The first buffer is placed at the leaf of each of the two buffer chains, and the second buffer is placed at a distance h1 from the end of each of the two buffer chains.

In step 910, h1 is initialized to a trial value, for example, 0.1 mm.

In step 912, a variable length1 representing the length of the buffer chain constructed from p1 is initialized to distance/2, and a variable length2 representing the length of the buffer chain constructed from p2 is initialized to distance/2.

In step 914, a variable h21 representing the distance between neighboring intermediate buffers for the first buffer chain from p1 is initialized according to the formula:

$$h21=(\text{length1}-h1)/k1 \quad (6)$$

and a variable h22 representing the distance between neighboring intermediate buffers for the second buffer chain from p2 is initialized according to the formula:

$$h22=(\text{length2}-h1)/k2 \quad (7)$$

In step 916, the target delay target1 is calculated for the first buffer chain including the initial skew delay1 as a function of input ramptime and the load of the clock net, for example, by a model that combines a parabolic approximation model with a piecewise linear continuous model. The delay calculation function may be implemented as a lookup table from the model according to well known techniques.

In step 918, the length of the buffer chain described with regard to FIG. 7 is adjusted using the target delay target1 and the initial skew delay1 to calculate a new value of h21.

In step 920, the target delay target2 is calculated for the second buffer chain including the initial skew delay2 as described in step 916.

In step 922, the length of the buffer chain described with regard to FIG. 7 is adjusted using the target delay target2 and the initial skew delay2 to calculate a new value of h22.

In step 924, the balanced clock tree described with reference to FIG. 8 is constructed using the target delay of max(target1, target2).

In step 926, a clock buffer is inserted at the midpoint p0 between p1 and p2, and the two buffer chains from p1 and p2 are connected to the output pin of the clock buffer to form a clock net.

In step 928, the load of the clock net is calculated for the two buffer chains connected to the output pin of the clock buffer.

In step 930, the real ramptime for the midpoint p0 is calculated using a trial value of input_ramptime equal to, for example, 0.05 as described above with regard to FIG. 2.

In step 932, the delays of the two buffer chains connected to the output pin of the clock buffer are recalculated.

In step 934, the skew for the midpoint p0 is calculated as the delay for an input ramptime equal to 0.05 and a load of the clock net from step 928 plus the average value of the recalculated delays for p1 and p2 from step 932.

Step 936 is the exit point for the flow chart 900.

FIG. 10 illustrates a flow chart 1000 for constructing a clock tree with initial skews for an arbitrary number of leaves, that is, clocked buffer cells, according to an embodiment of the present invention.

Step 1002 is the entry point for the flow chart 1000.

In step 1004, a list of coordinates for the leaves, that is, the clocked buffer cells, of the clock tree with initial skews is received as input.

In step 1006, the list of coordinates is sorted by initial skew so that the first point p1 has the minimum initial skew and the last point pn has the maximum initial skew.

In step 1008, a point p2 is selected that is nearest to the first point p1 by Hemming (or Manhattan) distance according to formula (5).

In step 1010, the algorithm for delay balancing described above with regard to FIG. 9 is applied for p1 and p2 to calculate a new point p0 with a corresponding skew.

In step 1012, the entries for p1 and p2 are removed from the sorted list and replaced by p0 and the corresponding skew.

In step 1014, if there is more than one point remaining in the list, then control is transferred back to step 1006. Otherwise, control is transferred to step 1016.

In step 1016, the CLOCK input is assigned to the input pin of the clock buffer at p0, which is the root of the clock tree.

Step 1018 is the exit point of the flow chart 1000.

FIG. 11 illustrates a flow chart 1100 for constructing a clock tree with improved skew for an arbitrary number of clocked cells without initial skews in accordance with an embodiment of the present invention. This algorithm may be used to construct a clock tree for the non-memory cells in the circuit design.

Step 1102 is the entry point of the flow chart 1100.

In step 1104, the algorithm for partitioning a circuit design described with reference to FIG. 1 is applied to generate a list of segments.

In step 1106, a next segment is selected from the segment list generated in step 1104.

In step 1108, if the segment contains at most the lower threshold number of clocked cells, or leaves, then control is transferred to step 1110. Otherwise, control is transferred to step 1112.

In step 1110, the algorithm for inserting clock buffers in low-density segments illustrated in the flow chart 300 of FIG. 3 is applied to the selected segment, and control is transferred to step 1114.

In step 1112, the algorithm for inserting clock buffers in high-density segments illustrated in the flow chart 500 of FIG. 5 is applied to the selected segment.

In step 1114, if the last segment in the list is selected, then control is transferred to step 1116. Otherwise, control is transferred back to step 1106.

In step 1116, the initial skew is calculated for each segment during the process of its construction. The initial skew for each segment equals the total delay at the midpoint (buffer) of the segment.

In step 1118, the algorithm for constructing a clock tree with initial skews illustrated in the flow chart 1000 of FIG. 10 is applied.

Step 1120 is the exit point of the flow chart 1100.

FIG. 12 illustrates a method of synthesizing a clock tree for the entire circuit design according to an embodiment of the present invention. Shown in FIG. 12 are a clock buffer 1202, a memory cell clock tree 1204, and a non-memory cell clock tree 1206.

The clock tree synthesis for the entire circuit design may be performed by generating the first clock tree 1204 only for the memory circuits with the initial skews for memories using the algorithm for constructing a clock tree with initial skews illustrated in FIG. 10. The initial skews for the remaining clocked cells are not significant because the peak power consumption of the remaining clocked cells is much smaller than the power consumption of the memory cells. The second clock tree 1206 may be constructed for the non-memory clocked cells, for example, by using Avant! GCTS or the algorithm for constructing a clock tree with improved skew illustrated in the flow chart of FIG. 11. The clock tree circuit for the entire circuit design may then be constructed by applying the algorithm for balancing delay between two points. The first point is the root vertex t1 of the first clock tree 1204 with the corresponding skew s1, and the second point is the root vertex t2 of the second clock tree 1206 with the corresponding skew s2.

Although the methods of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The methods illustrated in the flowchart descriptions above may be embodied in a computer program product according to various embodiments of the present invention and implemented by a computer according to well known programming techniques to perform the following functions:

partitioning a circuit design into a set of memory cells and a set of non-memory cells;

constructing a first clock tree having a first root vertex with a corresponding initial skew for the set of memory cells;

constructing a second clock tree having a second root vertex with a corresponding initial skew for the set of non-memory cells;

balancing delay between the first root vertex and the second vertex; and inserting a clock buffer between the first root vertex and the second root vertex.

In one embodiment, the function of partitioning a circuit design includes partitioning the set of memory cells into segments wherein each segment satisfies the following constraints:

(1) the segment includes a number of clocked cells that does not exceed an upper threshold;

(2) the segment has a width that does not exceed a selected horizontal threshold; and (3) the segment has a height that does not exceed a selected vertical threshold.

In another embodiment, the function of partitioning a circuit design includes the following steps:

(a) receiving as input a rectangle defined by the coordinates (x1, y1, y2, y2) enclosing a circuit design core, or outline;

(b) initializing a segment list to null, that is, empty;

(c) if the current rectangle contains more clocked cells than the upper threshold, or if x21=x2−x1 is greater than the horizontal threshold, or if y21=y2−y1 is greater than the vertical threshold, then transferring control to step (d); otherwise transferring control to step (f);

(d) partitioning the current rectangle into two rectangles having equal area according to the following formulas:

$$x21 = x2 - x1$$
$$y21 = y2 - y1$$
$$x0 = (x1 + x2)/2$$
$$y0 = (y1 + y2)/2$$

wherein if x21 is greater than y21, then defining the two rectangles by the coordinates (x1, y1, x0, y2) and (x0, y1, y2, y2) and wherein if x21 is less than or equal to y21, then defining the two rectangles by the coordinates (x1, y1, y2, y0) and (x1, y0, y2, y2);

(e) inserting the two rectangles into a recursion list and transferring control to step (g);

(f) if all three of the constraints in step (c) are satisfied, then inserting the coordinates of the current rectangle into the segment list for each segment in the partition of the circuit design;

(g) selecting the next rectangle in the recursion list as the current rectangle; and (h) deleting the current rectangle from the recursion list and transferring control to step (c) until the recursion list is empty.

In a further embodiment, the function of partitioning a circuit design includes the following steps:

(a) receiving the values of the coordinates (x1, y1, y2, y2) as input to define a current rectangle;

(b) initializing a segment list defining the partitioning of the circuit design to null;

(c) calculating values for x21, y21, x0, and y0;

(d) counting a number of clocked cells enclosed within the current rectangle;

(e) if the current rectangle contains more clocked cells than the upper threshold, or if x21=x2−x1 is greater than the horizontal threshold, or if y21=y2−y1 is greater than the vertical threshold, then transferring control to (f), otherwise transferring control to (i);

(f) if x21 is greater than y21, then transferring control to (g), otherwise transferring control to (h);

(g) partitioning the circuit design recursively with new coordinate values (x1, y1, x0, y2) and (x0, y1, y2, y2) for the two rectangles partitioned from the current rectangle;

(h) partitioning the circuit design recursively with new values (x1, y1, y2, y0) and (x1, y0, y2, y2) for the two rectangles partitioned from the current rectangle; and (i) inserting values of the coordinates (x1, y1, y2, y2) for the current rectangle into the segment list.

In another embodiment, the function of constructing a first clock tree includes the following steps:

(a) receiving a list of coordinates for leaves of the first clock tree with initial skews as input, (b) sorting the list of coordinates by initial skew to generate a sorted list of coordinates wherein a first point p1 has a minimum initial skew and a last point pn has a maximum initial skew;

(c) selecting a point p2 that is nearest to the first point p1 by Hemming distance;

(d) balancing delay between p1 and p2 to calculate a new point p0 with a corresponding skew;

(e) removing entries for p1 and p2 from the sorted list of coordinates and inserting an entry for p0 and the corresponding skew into the sorted list of coordinates;

(f) if more than one point remains in the sorted list of coordinates, then transferring control back to (b), otherwise transferring control to (g); and (g) assigning a CLOCK input to an input pin of a clock buffer at p0.

In a further embodiment, the function of balancing delay between p1 and p2 includes the following steps:

(a) receiving as input the values of the coordinates (x1, y1) of the first point p1, the value of the corresponding first initial skew delay delay1, the values of the coordinates (y2, y2) of the first point p2, and the value of the corresponding second initial skew delay delay2;

(b) calculating the distance between points p1 and p2 according to the formula:

$$distance = abs(x1-x2) + abs(y1-y2);$$

(c) initializing a variable k1 representing a first number of intermediate clock buffers in a first buffer chain between a root of the first clock tree and p1 equal to one and a variable k2 representing a second number of intermediate clock buffers in a second buffer chain between the root of the first clock tree and p2 equal to one;

(d) initializing h1 to a trial value;

(e) initializing a variable length1 representing a length of the first buffer chain constructed from p1 to distance/2 and a variable length2 representing a length of the second buffer chain constructed from p2 to distance/2.

(f) initializing a variable h21 representing a distance between neighboring intermediate buffers for the first buffer chain from p1 according to the formula:

$$h21 = (length1 - h1)/k1$$

and a variable h22 representing a distance between neighboring intermediate buffers for the second buffer chain from p2 according to the formula:

$$h22 = (length2 - h1)/k2;$$

(g) calculating a target delay target1 for the first buffer chain including the first initial skew delay1;

(h) adjusting the length of the first buffer chain using the target delay target1 and the first initial skew delay1 to calculate a new value of h21;

(i) calculating a target delay target2 for the second buffer chain including the second initial skew delay2;

(j) adjusting a length of the second buffer chain using the target delay target2 and the second initial skew delay2 to calculate a new value of h22;

(k) constructing a balanced clock tree using a target delay of max(target1, target2);

(l) inserting a clock buffer at a midpoint p0 between p1 and p2, and connecting the first and second buffer chains to an output pin of the clock buffer to form a clock net;

(m) calculating a load of the clock net for the first and second buffer chains connected to the output pin of the clock buffer;

(n) calculating a ramptime for the midpoint p0 using a trial value of input_ramptime;

(o) recalculating delays of the first and second buffer chains; and (p) calculating a skew for the midpoint p0.

In another embodiment, the function of adjusting a length of a buffer chain includes the following steps:

(a) receiving as input values for length, target, and initial_skew, h1, and a number of intermediate buffers k;

(b) initializing a variable h2_lower to zero and the variable h2_upper to 2(length−h1)/k;

(c) setting h2 equal to (h2_lower+h2_upper)/2 to generate a trial value of h2 and calculating a delay of the buffer chain using the trial value of h2;

(d) if the difference between the calculated delay of the buffer chain and the target delay plus the initial skew is greater than a first limit epsilon1, then transferring control to (e), otherwise transferring control to (l);

(e) if the calculated delay of the buffer chain is less than the target delay minus the initial skew, then transferring control to (f), otherwise transferring control to (g);

(f) setting h2_lower equal to h2 to increase the value of h2 and transferring control to (h);

(g) setting h2_upper equal to h2 to decrease the value of h2 and transferring control to (h);

(h) if h2_upper minus h2_lower is less than a second limit epsilon2, then transferring control to step 720, otherwise transferring control back to (c);

(i) setting k equal to k−1 to delete an intermediate clock buffer so that h2 may be further increased;

(j) if k is greater than zero, then transferring control to (b), otherwise transferring control to (k);

(k) setting h2 to zero; and (l) returning h2 as a new distance between neighboring intermediate clock buffers for a balanced clock buffer chain.

In a further embodiment, the function of adjusting a length of a buffer chain includes the following steps:

(a) receiving as input values for a length of a buffer chain length, a target delay target, and an initial skew initial_skew for a buffer chain;

(b initializing a variable k_lower is initialized to zero and k_upper to a trial value;

(c) setting a trial value for a number of additional clock buffers k equal to (k_lower+k_upper)/2 and h2 is set equal to (length−1)/k;

(d) if k_lower is equal to k_upper−1, then transferring control to (i), otherwise transferring control to (e);

(e) calculating a delay for the number of additional clock buffers k and the neighboring distance h2;

(f) if the delay plus the initial skew is less than the target delay, then transferring control to (g), otherwise transferring control to (h);

(g) setting k_lower equal to k to increase the value of k and transferring control back to (c);

(h) setting k_upper equal to k to decrease the value of k and transferring control back to (c); and (i) returning k_upper as the number of additional clock buffers to insert in the clock buffer chain.

In a further embodiment, the function of constructing a second clock tree includes the following steps:

(a) partitioning the set of memory cells to generate a segment list;

(b) selecting a next segment from the segment list;

(c) if the segment contains at most lower_threshold clocked cells, then transferring control to (d), otherwise transferring control to (e);

(d) inserting clock buffers for a low density segment in the selected segment and transferring control to (f);

(e) inserting clock buffers for a high density segment in the selected segment;

(f) if the last segment in the list is selected, then transferring control to (g), otherwise transferring control back to (b);

(g) calculating an initial skew for each segment in the segment list; and (h) constructing the second clock tree from the initial skew calculated for each segment.

In another embodiment, the function of constructing a second clock tree includes the following steps:

(a) receiving as input a list of coordinates for leaves of the clock tree with initial skews;

(b) sorting the list of coordinates by initial skew to generate a sorted list wherein a first point p1 has a minimum initial skew and a last point pn has a maximum initial skew;

(c) selecting a point p2 that is nearest to the first point p1 by Hemming distance;

(d) balancing delay between p1 and p2 to calculate a new point p0 with a corresponding skew;

(e) removing entries for p1 and p2 from the sorted list and inserting p0 and the corresponding skew into the sorted list;

(f) if more than one point remains in the sorted list, then transferring control back to (b), otherwise transferring control to (g); and (g) assigning a CLOCK input to an input pin of a clock buffer at p0.

In another embodiment, the function of inserting clock buffers for a low density segment includes the following steps:

(a) if the segment contains no more than the number of clocked cells defined by the upper threshold, then transferring control to (b), otherwise transferring control to (g);

(b) inserting a clock buffer in the center of the segment;

(c) connecting an output port of the clock buffer to clock inputs of clocked cells in the segment;

(d) calculating a delay between an input pin and an output pin of the clock buffer as a function of an input ramptime and a load represented by a clock net connected to the clock inputs of the clocked cells in the segment.

(e) estimating a trial value for the input ramptime to calculate a delay and ramptime;

(f) recalculating the delay and ramptime for an arc between an input pin and an output pin of the clock buffer; and (g) terminating insertion of clock buffers for a low density segment.

In another embodiment, the function of inserting clock buffers for a high density segment includes the following steps:

(a) if the segment contains more than a number of clocked cells defined by the upper threshold, then transferring control to (b), otherwise, control is transferred to (p);

(b) calculating a square root of a number of clocked cells cell_numb contained in the segment, rounding to a first nearest integer, and denoting the nearest integer by sqr_cell_numb;

(c) calculating a square root of sqr_cell_numb, rounding to a second nearest integer, and denoting the second nearest integer by numb4;

(d) generating a series containing sqr_cell_numb terms n1, n2, ... and rounding each of the terms to a corresponding nearest integer to denote a number of clocked cells in a corresponding sub-segment;

(e) generating a series r1, r2, ... containing numb4 terms and rounding each of the terms to a corresponding nearest integer to denotes a number of rows, or sub-segments, in each column of the segment;

(f) ordering the clocked cells contained in the segment by first coordinate sorting;

(g) partitioning the segment into numb4 columns;

(h) calculating a number of clocked cells in each column cells4column[i], wherein i=1, 2, ... numb4;

(i) assigning a number of clocked cells in the ordered list sorted by first coordinate corresponding to the number of clocked cells in each column to a corresponding i-th column;

(j) re-ordering the clocked cells in each column by second coordinate sorting;

(k) inserting a clock buffer for a low density segment in each sub-segment;

(l) inserting a clock buffer in the center of the segment and connecting an output of the clock buffer to an input pin of each clock buffer in each sub-segment;

(m) calculating the load, ramptime, and delay of an output pin of the clock buffer inserted the center of the segment as a segment delay;

(n) recalculating delays for the sub-segments using the calculated ramptime;

(o) adding an average value of the delays for the sub-segments is added to the segment delay; and (p) terminating insertion of clock buffers for a high density segment.

While the invention herein disclosed has been described by means of specific embodiments and applications thereof, numerous modifications and variations could be made thereto by those skilled in the art without departing from the scope of the invention set forth in the following claims.

What is claimed is:

1. A method of synthesizing a clock tree comprising:
  partitioning a circuit design into a set of memory cells and a set of non-memory cells;
  constructing a first clock tree having a first root vertex with a corresponding initial skew for the set of memory cells;
  constructing a second clock tree having a second root vertex with a corresponding initial skew for the set of non-memory cells;
  balancing delay between the first root vertex and the second vertex; and
  inserting a clock buffer at a midpoint between the first root vertex and the second root vertex;
  wherein partitioning a circuit design comprises partitioning the set of memory cells into segments wherein each segment satisfies the following constraints:
    (1) the segment includes a number of clocked cells that does not exceed an upper threshold;
    (2) the segment has a width that does not exceed a selected horizontal threshold; and
    (3) the segment has a height that does not exceed a selected vertical threshold.

2. The method of claim 1 wherein partitioning a circuit design comprises:
  (a) receiving as input a rectangle defined by the coordinates (x1, y1, y2, y2) enclosing a circuit design core, or outline;
  (b) initializing a segment list to null, that is, empty;
  (c) if the current rectangle contains more clocked cells than the upper threshold, or if x21=x2−x1 is greater than the horizontal threshold, or if y21=y2−y1 is greater than the vertical threshold, then transferring control to step (d); otherwise transferring control to step (f);
  (d) partitioning the current rectangle into two rectangles having equal area according to the following formulas:

$x21=x2-x1$ $y21=y2-y1$ $x0=(x1+x2)/2$ $y0=(y1+y2)/2$ wherein if x21 is greater than y21, then defining the two rectangles by the coordinates (x1, y1, x0, y2) and (x0, y1, y2, y2) and wherein if x21 is less than or equal to y21, then defining the two rectangles by the coordinates (x1, y1, y2, y0) and (x1, y0, y2, y2);

(e) inserting the two rectangles into a recursion list and transferring control to step (g);

(f) if all three of the constraints in step (c) are satisfied, then inserting the coordinates of the current rectangle into the segment list for each segment in the partition of the circuit design;

(g) selecting the next rectangle in the recursion list as the current rectangle; and (h) deleting the current rectangle from the recursion list and transferring control to step (c) until the recursion list is empty.

3. The method of claim 1 wherein partitioning a circuit design comprises:

(a) receiving the values of the coordinates (x1, y1, y2, y2) as input to define a current rectangle;

(b) initializing a segment list defining the partitioning of the circuit design to null;

(c) calculating values for x21, y21, x0, and y0;

(d) counting a number of clocked cells enclosed within the current rectangle;

(e) if the current rectangle contains more clocked cells than the upper threshold, or if x21=x2-x1 is greater than the horizontal threshold, or if y21=y2-y1 is greater than the vertical threshold, then transferring control to (f), otherwise transferring control to (i);

(f) if x21 is greater than y21, then transferring control to (g), otherwise transferring control to (h);

(g) partitioning the circuit design recursively with new coordinate values (x1, y1, x0, y2) and (x0, y1, y2, y2) for the two rectangles partitioned from the current rectangle;

(h) partitioning the circuit design recursively with new values (x1, y1, y2, y0) and (x1, y0, y2, y2) for the two rectangles partitioned from the current rectangle; and (i) inserting values of the coordinates (x1, y1, y2, y2) for the current rectangle into the segment list.

4. The method of claim 1 wherein constructing a first clock tree comprises:

(a) receiving a list of coordinates for leaves of the first clock tree with initial skews as input;

(b) sorting the list of coordinates by initial skew to generate a sorted list of coordinates wherein a first point p1 has a minimum initial skew and a last point pn has a maximum initial skew;

(c) selecting a point p2 that is nearest to the first point p1 by Hemming distance;

(d) balancing a delay between p1 and p2 to calculate a new point p0 with a corresponding skew;

(e) removing entries for p1 and p2 from the sorted list of coordinates and inserting an entry for p0 and the corresponding skew into the sorted list of coordinates;

(f) if more than one point remains in the sorted list of coordinates, then transferring control back to (b), otherwise transferring control to (g); and (g) assigning a CLOCK input to an input pin of a clock buffer at p0.

5. The method of claim 4 wherein balancing a delay between p1 and p2 comprises:

(a) receiving as input the values of the coordinates (x1, y1) of the first point p1, the value of the corresponding first initial skew delay delay1, the values of the coordinates (y2, y2) of the first point p2, and the value of the corresponding second initial skew delay delay2;

(b) calculating the distance between points p1 and p2 according to the formula:

$$distance=abs(x1-x2)+abs(y1-y2);$$

(c) initializing a variable k1 representing a first number of intermediate clock buffers in a first buffer chain between a root of the first clock tree and p1 equal to one and a variable k2 representing a second number of intermediate clock buffers in a second buffer chain between the root of the first clock tree and p2 equal to one;

(d) initializing h1 to a trial value;

(e) initializing a variable length1 representing a length of the first buffer chain constructed from p1 to distance/2 and a variable length2 representing a length of the second buffer chain constructed from p2 to distance/2;

(f) initializing a variable h21 representing a distance between neighboring intermediate buffers for the first buffer chain from p1 according to the formula:

$$h21=(length1-h1)/k1$$

and a variable h22 representing a distance between neighboring intermediate buffers for the second buffer chain from p2 according to the formula:

$$h22=(length2-h1)/k2;$$

(g) calculating a target delay target1 for the first buffer chain including the first initial skew delay1;

(h) adjusting the length of the first buffer chain using the target delay target1 and the first initial skew delay1 to calculate a new value of h21;

(i) calculating a target delay target2 for the second buffer chain including the second initial skew delay2;

(j) adjusting a length of the second buffer chain using the target delay target2 and the second initial skew delay2 to calculate a new value of h22;

(k) constructing a balanced clock tree using a target delay of max(target1, target2);

(l) inserting a clock buffer at a midpoint p0 between p1 and p2, and connecting the first and second buffer chains to an output pin of the clock buffer to form a clock net;

(m) calculating a load of the clock net for the first and second buffer chains connected to the output pin of the clock buffer;

(n) calculating a ramptime for the midpoint p0 using a trial value of input_ramptime;

(o) recalculating delays of the first and second buffer chains; and (p) calculating a skew for the midpoint p0.

6. The method of claim 4 wherein adjusting a length of a buffer chain comprises:

(a) receiving as input values for length, target, and initial_skew, h1, and a number of intermediate buffers k;

(b) initializing a variable h2_lower to zero and the variable h2_upper to 2(length−h1)/k;

(c) setting h2 equal to (h2_lower+h2_upper)/2 to generate a trial value of h2 and calculating a delay of the buffer chain using the trial value of h2;

(d) if the difference between the calculated delay of the buffer chain and the target delay plus the initial skew is greater than a first limit epsilon1, then transferring control to (e), otherwise transferring control to (l);

(e) if the calculated delay of the buffer chain is less than the target delay minus the initial skew, then transferring control to (f), otherwise transferring control to (g);

(f) setting h2_lower equal to h2 to increase the value of h2 and transferring control to (h);

(g) setting h2_upper equal to h2 to decrease the value of h2 and transferring control to (h);

(h) if h2_upper minus h2_lower is less than a second limit epsilon2, then transferring control to step 720, otherwise transferring control back to (c);

(i) setting k equal to k−1 to delete an intermediate clock buffer so that h2 may be further increased;

(j) if k is greater than zero, then transferring control to (b), otherwise transferring control to (k);

(k) setting h2 to zero; and (l) returning h2 as a new distance between neighboring intermediate clock buffers for a balanced clock buffer chain.

7. The method of claim 4 wherein adjusting a length of a buffer chain comprises:

(a) receiving as input values for a length of a buffer chain length, a target delay target, and an initial skew initial_skew for a buffer chain;

(b initializing a variable k_lower is initialized to zero and k_upper to a trial value;

(c) setting a trial value for a number of additional clock buffers k equal to (k_lower+k_upper)/2 and h2 is set equal to (length−1)/k;

(d) if k_lower is equal to k_upper−1, then transferring control to (i), otherwise transferring control to (e);

(e) calculating a delay for the number of additional clock buffers k and the neighboring distance h2;

(f) if the delay plus the initial skew is less than the target delay, then transferring control to (g), otherwise transferring control to (h);

(g) setting k_lower equal to k to increase the value of k and transferring control back to (c);

(h) setting k_upper equal to k to decrease the value of k and transferring control back to (c); and (i) returning k_upper as the number of additional clock buffers to insert in the clock buffer chain.

8. The method of claim 1 wherein constructing a second clock tree comprises:

(a) partitioning the set of memory cells to generate a segment list;

(b) selecting a next segment from the segment list;

(c) if the segment contains at most a lower threshold number of clocked cells wherein the upper threshold equals a square of the lower threshold, then transferring control to (d), otherwise transferring control to (e);

(d) inserting clock buffers for a low density segment in the selected segment and transferring control to (f);

(e) inserting clock buffers for a high density segment in the selected segment;

(f) if the last segment in the list is selected, then transferring control to (g), otherwise transferring control back to (b);

(g) calculating an initial skew for each segment in the segment list; and (h) constructing the second clock tree from the initial skew calculated for each segment.

9. The method of claim 8 wherein constructing a second clock tree comprises:

(a) receiving as input a list of coordinates for leaves of the clock tree with initial skews;

(b) sorting the list of coordinates by initial skew to generate a sorted list wherein a first point p1 has a minimum initial skew and a last point pn has a maximum initial skew;

(c) selecting a point p2 that is nearest to the first point p1 by Hemming distance;

(d) balancing delay between p1 and p2 to calculate a new new point p0 with a corresponding skew;

(e) removing entries for p1 and p2 from the sorted list and inserting p0 and the corresponding skew into the sorted list;

(f) if more than one point remains in the sorted list, then transferring control back to (b), otherwise transferring control to (g); and (g) assigning a CLOCK input to an input pin of a clock buffer at p0.

10. The method of claim 8 wherein inserting clock buffers for a low density segment comprises:

(a) if the segment contains no more than the number of clocked cells defined by the upper threshold, then transferring control to (b), otherwise transferring control to (g);

(b) inserting a clock buffer in the center of the segment;

(c) connecting an output port of the clock buffer to clock inputs of clocked cells in the segment;

(d) calculating a delay between an input pin and an output pin of the clock buffer as a function of an input ramptime and a load represented by a clock net connected to the clock inputs of the clocked cells in the segment.

(e) estimating a trial value for the input ramptime to calculate a delay and ramptime;

(f) recalculating the delay and ramptime for an arc between an input pin and an output pin of the clock buffer; and (g) terminating insertion of clock buffers for a low density segment.

11. The method of claim 8 wherein inserting clock buffers for a high density segment comprises:

(a) if the segment contains more than a number of clocked cells defined by the upper threshold, then transferring control to (b), otherwise, control is transferred to (p);

(b) calculating a square root of a number of clocked cells cell_numb contained in the segment, rounding to a first nearest integer, and denoting the nearest integer by sqr_cell_numb;

(c) calculating a square root of sqr_cell_numb, rounding to a second nearest integer, and denoting the second nearest integer by numb4;

(d) generating a series containing sqr_cell_numb terms n1, n2, . . . and rounding each of the terms to a corresponding nearest integer to denote a number of clocked cells in a corresponding sub-segment;

(e) generating a series r1, r2, ... containing numb4 terms and rounding each of the terms to a corresponding nearest integer to denotes a number of rows, or sub-segments, in each column of the segment;

(f) ordering the clocked cells contained in the segment by first coordinate sorting;

(g) partitioning the segment into numb4 columns;

(h) calculating a number of clocked cells in each column cells4column[i], wherein i=1, 2, ... numb4;

(i) assigning a number of clocked cells in the ordered list sorted by first coordinate corresponding to the number of clocked cells in each column to a corresponding i-th column;

(j) re-ordering the clocked cells in each column by second coordinate sorting;

(k) inserting a clock buffer for a low density segment in in each sub-segment;

(l) inserting a clock buffer in the center of the segment and connecting an output of the clock buffer to an input pin of each clock buffer in each sub-segment;

(m) calculating the load, ramptime, and delay of an output pin of the clock buffer inserted the center of the segment as a segment delay;

(n) recalculating delays for the sub-segments using the calculated ramptime;

(o) adding an average value of the delays for the sub-segments is added to the segment delay; and (p) terminating insertion of clock buffers for a high density segment.

12. A computer program product for synthesizing a clock tree comprising:

a medium for embodying a computer program for input to a computer; and a computer program embodied in the medium for causing the computer to perform the following functions:

partitioning a circuit design into a set of memory cells and a set of non-memory cells;

constructing a first clock tree having a first root vertex with a corresponding initial skew for the set of memory cells;

constructing a second clock tree having a second root vertex with a corresponding initial skew for the set of non-memory cells;

balancing delay between the first root vertex and the second vertex; and inserting a clock buffer at a midpoint between the first root vertex and the second root vertex;

wherein partitioning a circuit design comprises partitioning the set of memory cells into segments wherein each segment satisfies the following constraints:

(1) the segment includes a number of clocked cells that does not exceed an upper threshold;

(2) the segment has a width that does not exceed a selected horizontal threshold; and (3) the segment has a height that does not exceed a selected vertical threshold.

13. The computer program product of claim 12 wherein partitioning a circuit design comprises:

(a) receiving as input a rectangle defined by the coordinates (x1, y1, y2, y2) enclosing a circuit design core, or outline;

(b) initializing a segment list to null, that is, empty;

(c) if the current rectangle contains more clocked cells than the upper threshold, or if x21=x2−x1 is greater than the horizontal threshold, or if y21=y2−y1 is greater than the vertical threshold, then transferring control to step (d); otherwise transferring control to step (f);

(d) partitioning the current rectangle into two rectangles having equal area according to the following formulas:

$$x21=x2-x1$$

$$y21=y2-y1$$

$$x0=(x1+x2)/2$$

$$y0=(y1+y2)/2$$

wherein if x21 is greater than y21, then defining the two rectangles by the coordinates (x1, y1, x0, y2) and (x0, y1, y2, y2) and wherein if x21 is less than or equal to y21, then then defining the two rectangles by the coordinates (x1, y1, y2, y0) and (x1, y0, y2, y2);

(e) inserting the two rectangles into a recursion list and transferring control to step (g);

(f) if all three of the constraints in step (c) are satisfied, then inserting the coordinates of the current rectangle into the segment list for each segment in the partition of the circuit design;

(g) selecting the next rectangle in the recursion list as the current rectangle; and (h) deleting the current rectangle from the recursion list and transferring control to step (c) until the recursion list is empty.

14. The computer program product of claim 12 wherein partitioning a circuit design comprises:

(a) receiving the values of the coordinates (x1, y1, y2, y2) as input to define a current rectangle;

(b) initializing a segment list defining the partitioning of the circuit design to null;

(c) calculating values for x21, y21, x0, and y0;

(d) counting a number of clocked cells enclosed within the current rectangle;

(e) if the current rectangle contains more clocked cells than the upper threshold, or if x21=x2−x1 is greater than the horizontal threshold, or if y21=y2−y1 is greater than the vertical threshold, then transferring control to (f), otherwise transferring control to (i);

(f) if x21 is greater than y21, then transferring control to (g), otherwise transferring control to (h);

(g) partitioning the circuit design recursively with new coordinate values (x1, y1, x0, y2) and (x0, y1, y2, y2) for the two rectangles partitioned from the current rectangle;

(h) partitioning the circuit design recursively with new values (x1, y1, y2, y0) and (x1, y0, y2, y2) for the two rectangles partitioned from the current rectangle; and (i) inserting values of the coordinates (x1, y1, y2, y2) for the current rectangle into the segment list.

15. The computer program product of claim 12 wherein constructing a first clock tree comprises:

(a) receiving a list of coordinates for leaves of the first clock tree with initial skews as input;

(b) sorting the list of coordinates by initial skew to generate a sorted list of coordinates wherein a first point p1 has a minimum initial skew and a last point pn has a maximum initial skew;

(c) selecting a point p2 that is nearest to the first point p1 by Hemming distance;

(d) balancing a delay between p1 and p2 to calculate a new point p0 with a corresponding skew;

(e) removing entries for p1 and p2 from the sorted list of coordinates and inserting an entry for p0 and the corresponding skew into the sorted list of coordinates;

(f) if more than one point remains in the sorted list of coordinates, then transferring control back to (b), otherwise transferring control to (g); and (g) assigning a CLOCK input to an input pin of a clock buffer at p0.

16. The computer program product of claim 15 wherein balancing a delay between p1 and p2 comprises:

(a) receiving as input the values of the coordinates (x1, y1) of the first point p1, the value of the corresponding first initial skew delay delay1, the values of the coordinates (y2, y2) of the first point p2, and the value of the corresponding second initial skew delay delay2;

(b) calculating the distance between points p1 and p2 according to the formula:

$$distance=abs(x1-x2)+abs(y1-y2);$$

(c) initializing a variable k1 representing a first number of intermediate clock buffers in a first buffer chain between a root of the first clock tree and p1 equal to one and a variable k2 representing a second number of intermediate clock buffers in a second buffer chain between the root of the first clock tree and p2 equal to one;

(d) initializing h1 to a trial value;

(e) initializing a variable length1 representing a length of the first buffer chain constructed from p1 to distance/2 and a variable length2 representing a length of the second buffer chain constructed from p2 to distance/2;

(f) initializing a variable h21 representing a distance between neighboring intermediate buffers for the first buffer chain from p1 according to the formula:

$$h21=(length1-h1)/k1$$

and a variable h22 representing a distance between neighboring intermediate buffers for the second buffer chain from p2 according to the formula:

$$h22=(length2-h1)/k2;$$

(g) calculating a target delay target1 for the first buffer chain including the first initial skew delay1;

(h) adjusting the length of the first buffer chain using the target delay target1 and the first initial skew delay1 to calculate a new value of h21;

(i) calculating a target delay target2 for the second buffer chain including the second initial skew delay2;

(j) adjusting a length of the second buffer chain using the target delay target2 and the second initial skew delay2 to calculate a new value of h22;

(k) constructing a balanced clock tree using a target delay of max(target1, target2);

(l) inserting a clock buffer at a midpoint p0 between p1 and p2, and connecting the first and second buffer chains to an output pin of the clock buffer to form a clock net;

(m) calculating a load of the clock net for the first and second buffer chains connected to the output pin of the clock buffer;

(n) calculating a ramptime for the midpoint p0 using a trial value of input_ramptime;

(o) recalculating delays of the first and second buffer chains; and (p) calculating a skew for the midpoint p0.

17. The computer program product of claim 15 wherein adjusting a length of a buffer chain comprises:

(a) receiving as input values for length, target, and initial_skew, h1, and a number of intermediate buffers k;

(b) initializing a variable h2_lower to zero and the variable h2_upper to 2(length−h1)/k;

(c) setting h2 equal to (h2_lower+h2_upper)/2 to generate a trial value of h2 and calculating a delay of the buffer chain using the trial value of h2;

(d) if the difference between the calculated delay of the buffer chain and the target delay plus the initial skew is greater than a first limit epsilon1, then transferring control to (e), otherwise transferring control to (l);

(e) if the calculated delay of the buffer chain is less than the target delay minus the initial skew, then transferring control to (f), otherwise transferring control to (g);

(f) setting h2_lower equal to h2 to increase the value of h2 and transferring control to (h);

(g) setting h2_upper equal to h2 to decrease the value of h2 and transferring control to (h);

(h) if h2 upper minus h2_lower is less than a second limit epsilon2, then transferring control to step 720, otherwise transferring control back to (c);

(i) setting k equal to k-1 to delete an intermediate clock buffer so that h2 may be further increased;

(j) if k is greater than zero, then transferring control to (b), otherwise transferring control to (k);

(k) setting h2 to zero; and (l) returning h2 as a new distance between neighboring intermediate clock buffers for a balanced clock buffer chain.

18. The computer program product of claim 15 wherein adjusting a length of a buffer chain comprises:

(a) receiving as input values for a length of a buffer chain length, a target delay target, and an initial skew initial_skew for a buffer chain;

(b initializing a variable k_lower is initialized to zero and k_upper to a trial value;

(c) setting a trial value for a number of additional clock buffers k equal to (k_lower+k_upper)/2 and h2 is set equal to (length−1)/k;

(d) if k_lower is equal to k_upper−1, then transferring control to (i), otherwise transferring control to (e);

(e) calculating a delay for the number of additional clock buffers k and the neighboring distance h2;

(f) if the delay plus the initial skew is less than the target delay, then transferring control to (g), otherwise transferring control to (h);

(g) setting k_lower equal to k to increase the value of k and transferring control back to (c);

(h) setting k_upper equal to k to decrease the value of k and transferring control back to (c); and (i) returning k_upper as the number of additional clock buffers to insert in the clock buffer chain.

19. The computer program product of claim 12 wherein constructing a second clock tree comprises:

(a) partitioning the set of memory cells to generate a segment list;

(b) selecting a next segment from the segment list;

(c) if the segment contains at most a lower threshold number of clocked cells wherein the upper threshold equals a square of the lower threshold, then transferring control to (d), otherwise transferring control to (e);

(d) inserting clock buffers for a low density segment in the selected segment and transferring control to (f);

(e) inserting clock buffers for a high density segment in the selected segment;

(f) if the last segment in the list is selected, then transferring control to (g), otherwise transferring control back to (b);

(g) calculating an initial skew for each segment in the segment list; and (h) constructing the second clock tree from the initial skew calculated for each segment.

20. The computer program product of claim 19 wherein constructing a second clock tree comprises:

(a) receiving as input a list of coordinates for leaves of the clock tree with initial skews;

(b) sorting the list of coordinates by initial skew to generate a sorted list wherein a first point p1 has a minimum initial skew and a last point pn has a maximum initial skew;

(c) selecting a point p2 that is nearest to the first point p1 by Hemming distance;

(d) balancing delay between p1 and p2 to calculate a new point p0 with a corresponding skew;

(e) removing entries for p1 and p2 from the sorted list and inserting p0 and the corresponding skew into the sorted list;

(f) if more than one point remains in the sorted list, then transferring control back to (b), otherwise transferring control to (g); and (g) assigning a CLOCK input to an input pin of a clock buffer at p0.

21. The computer program product of claim 19 wherein inserting clock buffers for a low density segment comprises:

(a) if the segment contains no more than the number of clocked cells defined by the upper threshold, then transferring control to (b), otherwise transferring control to (g);

(b) inserting a clock buffer in the center of the segment;

(c) connecting an output port of the clock buffer to clock inputs of clocked cells in the segment;

(d) calculating a delay between an input pin and an output pin of the clock buffer as a function of an input ramptime and a load represented by a clock net connected to the clock inputs of the clocked cells in the segment.

(e) estimating a trial value for the input ramptime to calculate a delay and ramptime;

(f) recalculating the delay and ramptime for an arc between an input pin and an output pin of the clock buffer; and (g) terminating insertion of clock buffers for a low density segment.

22. The computer program product of claim 19 wherein inserting clock buffers for a high density segment comprises:

(a) if the segment contains more than a number of clocked cells defined by the upper threshold, then transferring control to (b), otherwise, control is transferred to (p);

(b) calculating a square root of a number of clocked cells cell_numb contained in the segment, rounding to a first nearest integer, and denoting the nearest integer by sqr_cell_numb;

(c) calculating a square root of sqr_cell_numb, rounding to a second nearest integer, and denoting the second nearest integer by numb4;

(d) generating a series containing sqr_cell_numb terms n1, n2, . . . and rounding each of the terms to a corresponding nearest integer to denote a number of clocked cells in a corresponding sub-segment;

(e) generating a series r1, r2, . . . containing numb4 terms and rounding each of the terms to a corresponding nearest integer to denotes a number of rows, or sub-segments, in each column of the segment;

(f) ordering the clocked cells contained in the segment by first coordinate sorting;

(g) partitioning the segment into numb4 columns;

(h) calculating a number of clocked cells in each column cells4column[i], wherein i=1, 2, . . . numb4;

(i) assigning a number of clocked cells in the ordered list sorted by first coordinate corresponding to the number of clocked cells in each column to a corresponding i-th column;

(j) re-ordering the clocked cells in each column by second coordinate sorting;

(k) inserting a clock buffer for a low density segment in each sub-segment;

(l) inserting a clock buffer in the center of the segment and connecting an output of the clock buffer to an input pin of each clock buffer in each sub-segment;

(m) calculating the load, ramptime, and delay of an output pin of the clock buffer inserted the center of the segment as a segment delay;

(n) recalculating delays for the sub-segments using the calculated ramptime;

(o) adding an average value of the delays for the sub-segments is added to the segment delay; and (p) terminating insertion of clock buffers for a high density segment.

* * * * *